(12) United States Patent
Kwon et al.

(10) Patent No.: US 11,301,399 B2
(45) Date of Patent: Apr. 12, 2022

(54) MEMORY DEVICE INCLUDING PROCESSING CIRCUIT, AND ELECTRONIC DEVICE INCLUDING SYSTEM ON CHIP AND MEMORY DEVICE

(71) Applicant: SAMSUNG ELECTRONICS CO., LTD., Suwon-si (KR)

(72) Inventors: Sang-Hyuk Kwon, Seoul (KR); Nam Sung Kim, Yongin-si (KR); Kyomin Sohn, Yongin-si (KR); Jaeyoun Youn, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/934,497

(22) Filed: Jul. 21, 2020

(65) Prior Publication Data

US 2021/0157751 A1 May 27, 2021

(30) Foreign Application Priority Data

Nov. 22, 2019 (KR) .......................... 10-2019-0150924

(51) Int. Cl.
*G06F 13/38* (2006.01)
*G06F 13/16* (2006.01)
*H01L 25/065* (2006.01)
*G11C 8/10* (2006.01)
*G11C 7/10* (2006.01)

(52) U.S. Cl.
CPC ...... *G06F 13/1668* (2013.01); *H01L 25/0657* (2013.01); *G11C 7/10* (2013.01); *G11C 8/10* (2013.01); *H01L 2225/06541* (2013.01)

(58) Field of Classification Search
CPC ............. G06F 13/1668; H01L 25/0657; H01L 2225/06541; G11C 7/10; G11C 8/10
See application file for complete search history.

(56) References Cited

U.S. PATENT DOCUMENTS

| | | | | |
|---|---|---|---|---|
| 7,999,367 B2 * | 8/2011 | Kang | ..................... | G11C 5/063 257/686 |
| 8,031,505 B2 * | 10/2011 | Kang | ..................... | G11C 8/12 365/51 |
| 8,174,115 B2 * | 5/2012 | Chung | ..................... | G11C 5/04 257/723 |
| 8,253,227 B2 * | 8/2012 | Osada | ..................... | H01L 23/50 257/685 |

(Continued)

*Primary Examiner* — Cheng Yuan Tseng
(74) *Attorney, Agent, or Firm* — Sughrue Mion, PLLC

(57) ABSTRACT

A memory device includes a buffer die configured to receive a first broadcast command and a second broadcast command from an external device; and a plurality of core dies stacked on the buffer die. The plurality of core dies include: a first core die including a first processing circuit, a first memory cell array, a first command decoder configured to decode the first broadcast command, and a first data input/output circuit configured to output data of the first memory cell array to a common data input/output bus under control of the first command decoder; and a second core die including a second processing circuit, a second memory cell array, a second command decoder configured to decode the second broadcast command, and a second data input/output circuit configured to receive the data of the first memory cell array through the common data input/output bus under control of the second command decoder.

18 Claims, 17 Drawing Sheets

(56) References Cited

U.S. PATENT DOCUMENTS

| | | | |
|---|---|---|---|
| 8,384,432 B2* | 2/2013 | Kondo | G11C 5/02 326/82 |
| 8,599,641 B2* | 12/2013 | Yoko | G11C 29/50012 365/233.1 |
| 8,619,486 B2* | 12/2013 | Hayashi | G11C 11/40615 365/222 |
| 8,693,277 B2* | 4/2014 | Hayashi | G11C 8/12 365/230.03 |
| 8,773,939 B2* | 7/2014 | Oh | G11C 8/12 365/230.03 |
| 9,013,908 B2* | 4/2015 | Chang | G11C 29/26 365/63 |
| 9,230,609 B2* | 1/2016 | Frans | G11C 5/02 |
| 9,558,143 B2 | 1/2017 | Leidel | |
| 9,851,401 B2* | 12/2017 | Kim | G01R 31/31813 |
| 9,971,541 B2 | 5/2018 | Lea et al. | |
| 9,997,232 B2 | 6/2018 | Murphy | |
| 10,062,428 B2* | 8/2018 | Lee | G06F 3/0659 |
| 10,083,722 B2* | 9/2018 | Oh | G11C 7/1006 |
| 10,090,038 B2* | 10/2018 | Shin | G11C 7/106 |
| 10,163,469 B2* | 12/2018 | Kondo | G11C 16/32 |
| 10,236,038 B2 | 3/2019 | Lea et al. | |
| 10,365,325 B2* | 7/2019 | Dono | G11C 29/022 |
| 10,459,871 B2* | 10/2019 | Funahashi | G06F 13/1689 |
| 10,614,859 B2* | 4/2020 | Vogelsang | H01L 25/0657 |
| 10,748,601 B2* | 8/2020 | Kim | G11C 5/06 |
| 10,790,266 B2* | 9/2020 | Ito | G11C 5/14 |
| 10,916,489 B1* | 2/2021 | Nishioka | G11C 29/006 |
| 11,004,477 B2* | 5/2021 | Shibata | H01L 27/0688 |
| 2012/0051113 A1* | 3/2012 | Choi | G11C 29/12 365/51 |
| 2013/0162275 A1* | 6/2013 | Kurihara | G06F 11/3065 324/750.3 |
| 2016/0357630 A1* | 12/2016 | Kang | G11C 29/52 |
| 2019/0057050 A1 | 2/2019 | Mathuriya et al. | |
| 2019/0146788 A1* | 5/2019 | Kim | G11C 11/54 712/221 |
| 2019/0205273 A1 | 7/2019 | Kavalieros et al. | |
| 2019/0303042 A1* | 10/2019 | Kim | G11C 11/4087 |
| 2020/0210296 A1* | 7/2020 | Kang | G06F 12/0895 |

\* cited by examiner

MEMORY DEVICE INCLUDING PROCESSING CIRCUIT, AND ELECTRONIC DEVICE INCLUDING SYSTEM ON CHIP AND MEMORY DEVICE

CROSS-REFERENCE TO THE RELATED APPLICATION

This application claims priority under 35 U.S.C. § 119 to Korean Patent Application No. 10-2019-0150924 filed on Nov. 22, 2019, in the Korean Intellectual Property Office, the disclosure of which is incorporated by reference herein in its entirety.

BACKGROUND

Methods and apparatuses consistent with example embodiments relate to a memory device including a processing circuit, and more particularly, relate to an electronic device including a system on chip and a memory device.

A plurality of semiconductor dies may be stacked to increase the degree of integration of a memory device. A memory device of a three-dimensional structure may process a large amount of data at a high speed. To implement the three-dimensional structure, a through silicon via (TSV) may be used to stack a plurality of semiconductor dies. As data processing speed increases, the separation of a processor from a memory causes a latency of data that are transmitted between the processor and the memory.

SUMMARY

Example embodiments provide a memory device including a processing circuit, and an electronic device including a system on chip and a memory device.

According to an example embodiment, a memory device includes a buffer die configured to receive a first broadcast command and a second broadcast command from an external device; and a plurality of core dies stacked on the buffer die. The plurality of core dies include: a first core die including a first processing circuit, a first memory cell array, a first command decoder configured to decode the first broadcast command, and a first data input/output circuit configured to output data of the first memory cell array to a common data input/output bus under control of the first command decoder; and a second core die including a second processing circuit, a second memory cell array, a second command decoder configured to decode the second broadcast command, and a second data input/output circuit configured to receive the data of the first memory cell array through the common data input/output bus under control of the second command decoder.

According to an example embodiment, a memory device includes a buffer die configured to receive first to fourth broadcast commands from an external device through first to fourth channels, respectively; a first core die including a first processing circuit and a first memory cell array allocated to the first channel, a second processing circuit and a second memory cell array allocated to the second channel, a first data input/output circuit configured to output data of the first memory cell array to a first common data input/output bus under control of a first command decoder according to the first broadcast command, and a second data input/output circuit configured to output data of the second memory cell array to a second common data input/output bus under control of a second command decoder according to the second broadcast command; and a second core die including a third processing circuit and a third memory cell array allocated to the third channel, a fourth processing circuit and a fourth memory cell array allocated to the fourth channel, a third data input/output circuit configured to receive the data of the first common data input/output bus under control of a third command decoder according to the third broadcast command, and a fourth data input/output circuit configured to receive the data of the second common data input/output bus under control of a fourth command decoder according to the fourth broadcast command.

According to an example embodiment, an electronic device includes a memory device that includes a buffer die, a first core die including a first processing circuit and a first memory cell array allocated to a first channel, and a second core die including a second processing circuit and a second memory cell array allocated to a second channel; and a system on chip configured to transmit a first broadcast command and a second broadcast command requesting movement of data from the first core die to the second core die to the buffer die of the memory device through the first channel and the second channel, respectively.

BRIEF DESCRIPTION OF THE FIGURES

The above and other aspects, features and advantages will become apparent from the following detailed description of example embodiments, taken in conjunction with the accompanying drawings, in which.

DETAILED DESCRIPTION

Figure 1:
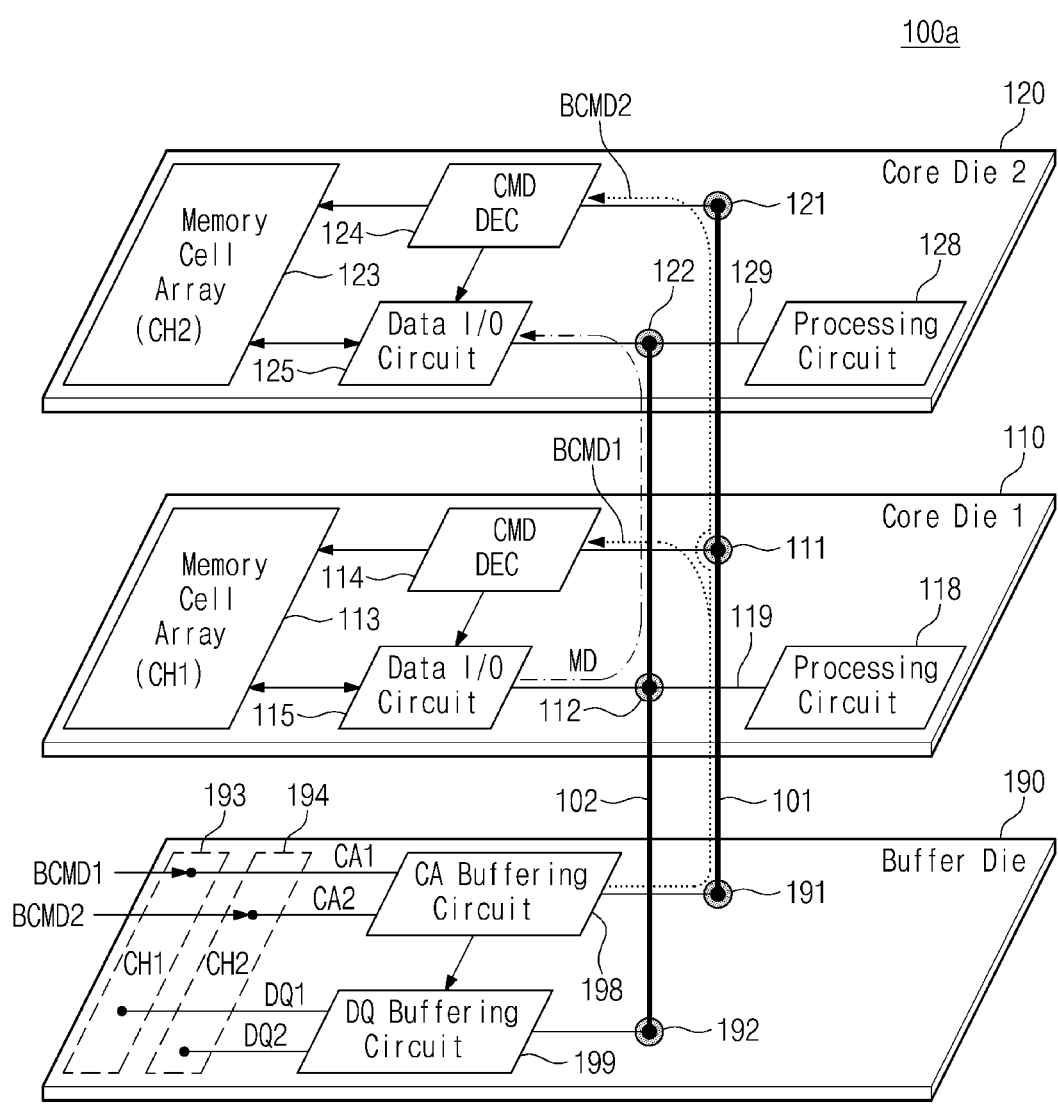
FIGS. 1 to 3 illustrate block diagrams of memory devices according to example embodiments.

FIG. 1 illustrates a block diagram of a memory device according to an example embodiment. A memory device 100a may relate to a processor in memory (PIM) or a function in memory (FIM) and may further execute a data processing operation in addition to reading and writing data. The memory device 100a may correspond to a computational memory device including a random access memory (RAM) and a processing element (PE) integrated in the same die.

The memory device 100a may include core dies 110 and 120 and a buffer die 190. For example, each of the core dies 110 and 120 may be also referred to a "memory die", a "PIM die", an "FIM die", or a "slave die", and the buffer die 190 may be also referred to as an "interface die", a "logic die", or a "master die". A die may be also referred to as a "chip".

The core die 110 may be stacked on the buffer die 190, and the core die 120 may be stacked on the core die 110. The memory device 100a may have a three-dimensional memory structure in which the plurality of dies 110, 120, and 190 are stacked.

The memory device 100a may include a common command and address bus 101 including paths through which command and address (or command/address) signals CA1 and CA2 are transmitted. The common command and address bus 101 may include through silicon vias (TSVs) 111 passing through the core die 110, TSVs 121 passing through the core die 120, TSVs 191 passing through the buffer die 190, and micro bumps (refer to 1102 of FIG. 15) providing an electrical connection or contact between the TSVs 111, 121, and 191. The memory device 100a may include a common data input/output bus 102 including paths through which data input/output signals DQ1 and DQ2 are transmitted. The common data input/output bus 102 may include TSVs 112 passing through the core die 110, TSVs 122 passing through the core die 120, TSVs 192 passing through the buffer die 190, and micro bumps (refer to 1102 of FIG. 15) providing an electrical connection or contact between the TSVs 112, 122, and 192. The core dies 110 and 120 and the buffer die 190 may be electrically interconnected through the common command and address bus 101 and the common data input/output bus 102.

The core die 110 may include the TSVs 111 and 112, a memory cell array 113 allocated to a channel CH1, a command decoder 114, a data input/output circuit 115, a processing circuit 118, and an internal data input/output bus 119. The channel CH1 may include access (or communication) paths capable of accessing the memory device 100a. For example, an external device (e.g., a memory controller, a system on chip (SoC), an application processor (AP), or a host) may access the memory cell array 113 through the channel CH1, may transmit commands and addresses associated with the memory cell array 113, and may exchange data on the memory cell array 113.

The memory cell array 113 may include memory cells connected to word lines (or rows) and bit lines (or columns). For example, a memory cell may be a dynamic random access (DRAM) cell, a static random access memory (SRAM) cell, a NAND flash memory cell, a NOR flash memory cell, a resistive random access memory (RRAM) cell, a ferroelectric random access memory (FRAM) cell, a phase change random access memory (PRAM) cell, a thyristor random access memory (TRAM) cell, a magnetic random access memory (MRAM) cell, etc.

The command decoder 114 may decode commands transmitted through the buffer die 190 and the common command and address bus 101. For example, the commands may include the following command associated with the memory cell array 113: an active command, a precharge command, a write command, and a refresh command; alternatively, the commands may include the following commands associated with an operation mode of the core die 110: a mode register set command, a mode register write command, and a mode register read command. Additionally, the commands may include a broadcast command requesting a data movement within the core dies 110 and 120 and a processing command requesting a processing operation on data of the core dies 110 and 120. The broadcast command may be also referred to as a "move command" or a "transfer command". The command decoder 114 may decode a command and may control the memory cell array 113 and the data input/output circuit 115.

The data input/output circuit 115 may receive write data through the common data input/output bus 102 and may transmit the write data to the memory cell array 113. The write data may be written, stored, or programmed to the memory cell array 113. The write data may be transmitted from the external device through the channel CH1, the buffer die 190, and the common data input/output bus 102, may be transmitted from the processing circuit 118 through the internal data input/output bus 119, or may be transmitted from the core die 120 through the common data input/output bus 102. The data input/output circuit 115 may read data stored in the memory cell array 113 or may output (or transmit) the read data to the common data input/output bus 102. The read data of the common data input/output bus 102 may be transmitted to the external device through the buffer die 190 and the channel CH1, may be transmitted to the core die 120 through the common data input/output bus 102, or may be transmitted to the processing circuit 118 through the internal data input/output bus 119.

The processing circuit 118 may perform a processing operation on data of the internal data input/output bus 119 or data of the common data input/output bus 102. For example, the data of the internal data input/output bus 119 may mean data output from the data input/output circuit 115 to the internal data input/output bus 119. For example, the data of the common data input/output bus 102 may mean data output from the data input/output circuit 115, the core die 120, or the buffer die 190 to the common data input/output bus 102. The processing circuit 118 may be disposed on the same core die 110 together with the memory cell array 113 and may be referred to as a "PE" or a "processor". For example, the processing circuit 118 may be accessed through the channel CH1 capable of accessing the memory cell array 113 and may be allocated to the channel CH1.

The paths of the internal data input/output bus 119 may be electrically connected to the paths of the common data input/output bus 102, respectively. Accordingly, the paths of the internal data input/output bus 119 may be included in the paths of the common data input/output bus 102. For another example, the paths of the internal data input/output bus 119 may be electrically separated from the paths of the common data input/output bus 102, respectively. In any case, the data input/output circuit 115 may output the same data to the internal data input/output bus 119 or the common data input/output bus 102.

The core die 120 may include the TSVs 121 and 122, a memory cell array 123, a command decoder 124, a data input/output circuit 125, a processing circuit 128, and an internal data input/output bus 129. For example, the core die 120 may be stacked on the core die 110. As in the channel CH1, a channel CH2 may include access (or communication) paths capable of accessing the memory device 100a and may be independent of the channel CH1. For example, the external device may access the memory cell array 123 or the processing circuit 128 through the channel CH2. The core die 120 may be implemented to be substantially identical to the core die 110. Operations of the components 123 to 129 of the core die 120 may be similar or substantially identical to the operations of the components 113 to 119 of the core die 110 except that the core die 120 is accessible through the channel CH2 and the core die 110 is accessible through the channel CH1.

The buffer die 190 may include the TSVs 191 and 192, pins 193 and 194, a command and address buffering circuit 198 and a data input/output buffering circuit 199. The pins 193 may be allocated to the channel CH1. The pins 193 may include command and address pins receiving command and address signals CA1 transmitted from the external device through the channel CH1 and data input/output pins receiving the data input/output signals DQ1 transmitted from the external device through the channel CH1. Because the data input/output signals DQ1 are bidirectional, the data input/output signals DQ1 may be transmitted from the above data input/output pins to the external device through the channel CH1. Here, "DQ" may mean a data input/output. The pins 194 may be implemented to be substantially identical to the pins 193 except that the pins 194 are allocated to the channel CH2.

The command and address buffering circuit 198 may buffer (i.e., receive and amplify) the command and address signals CA1 transmitted through the pins 193 and may output the command and address signals CA1 to the common command and address bus 101. The command and address signals CA1 may relate to the core die 110 and may in detail include commands for the memory cell array 113, addresses (e.g., including a bank address, a row address, and a column address) indicating memory cells of the memory cell array 113, or commands for the processing circuit 118. For example, the command and address buffering circuit 198 may output an identification (ID) (or an address) indicating the channel CH1 (or the core die 110) to the common command and address bus 101 together with the command and address signals CA1. The command decoder 114 may identify the ID of the channel CH1, may decode the command and address signals CA1, and may not decode the command and address signals CA2. As in the above manner, the command and address buffering circuit 198 may output the command and address signals CA2 to the common command and address bus 101. As in the command decoder 114, the command decoder 124 may identify the ID of the channel CH2 and may decode the command and address signals CA2.

The data input/output buffering circuit 199 may receive or output the data input/output signals DQ1 through the channel CH1 and the pins 193. The data input/output buffering circuit 199 may output the data input/output signals DQ1 and may further output the ID of the channel CH1 to the common data input/output bus 102. The data input/output circuit 115 may identify the ID of the channel CH1 and may receive the data input/output signals DQ1. The data input/output circuit 115 may also receive the data input/output signals DQ1 without identifying the ID of the channel CH1 under control of the command decoder 114. The data input/output circuit 115 may output the data input/output signals DQ1 to the common data input/output bus 102 and may further output the ID of the channel CH1 to the common data input/output bus 102. The data input/output buffering circuit 199 may receive the data input/output signals DQ1 through the common data input/output bus 102. For example, the data input/output buffering circuit 199 may identify the ID of the channel CH1 and may output the data input/output signals DQ1 to the external device through the pins 193 and the channel CH1. For another example, under control of the command and address buffering circuit 198, the data input/output buffering circuit 199 may output the data input/output signals DQ1 to the external device through the pins 193 and the channel CH1 without identifying the ID. As in the above manner, the data input/output buffering circuit 199 may output the data input/output signals DQ2. As in the data input/output circuit 115, the data input/output circuit 125 may identify the ID of the channel CH2 and output the data input/output signals DQ2.

Referring to FIG. 1, the memory device 100a may receive broadcast commands BCMD1 and BCMD2 from the external device through the channels CH1 and CH2, respectively. The broadcast commands BCMD1 and BCMD2 may request the movement of data from the memory cell array 113 allocated to the channel CH1 to the memory cell array 123 allocated to the channel CH2. For example, the broadcast command BCMD1 may indicate a start and a start location of the data movement (i.e., the memory cell array 113 allocated to the channel CH1), and the broadcast command BCMD2 may indicate an end (or target) and an end location of the data movement (i.e., the memory cell array 123 allocated to the channel CH2).

The command and address buffering circuit 198 may receive the broadcast command BCMD1 through the channel CH1 and the pins 193, may generate the ID of the channel CH1, and may output the broadcast command BCMD1 and the ID of the channel CH1 to the common command and address bus 101. The command decoder 114 may identify the ID of the channel CH1, may decode the broadcast command BCMD1, and may control the memory cell array 113 and the data input/output circuit 115. The data input/output circuit 115 may receive data stored in memory cells of the memory cell array 113, which addresses of the broadcast command BCMD1 indicate, and may output data MD to the common data input/output bus 102. For example, the operations of the memory cell array 113, the command decoder 114, and the data input/output circuit 115, which are performed in response to the broadcast command BCMD1, may correspond to a read operation of the core die 110, but the data MD may not be output to the external device unlike a normal read operation.

The command and address buffering circuit 198 may receive the broadcast command BCMD2 through the channel CH2 and the pins 194, may generate the ID of the channel CH2, and may output the broadcast command BCMD2 and the ID of the channel CH2 to the common command and address bus 101. The command decoder 124 may identify the ID of the channel CH2, may decode the broadcast command BCMD2, and may control the memory cell array 123 and the data input/output circuit 125. The data input/output circuit 125 may receive the data MD of the common data input/output bus 102. The received data MD of the data input/output circuit 125 may be transmitted to memory cells of the memory cell array 123, which addresses of the broadcast command BCMD2 or a next command indicate. For example, the operations of the memory cell array 123, the command decoder 124, and the data input/output circuit 125, which are performed in response to the broadcast command BCMD2, may correspond to a write operation of the core die 120, but the write data MD may be provided from the core die 110 and not from the external device unlike a normal write operation.

For example, the broadcast command BCMD1 may be transmitted to the memory device 100a prior to the broadcast command BCMD2. The order of transmitting the broadcast commands BCMD1 and BCMD2 may depend on a start and an end of the data movement. The broadcast command BCMD2 may be transmitted to the memory device 100a prior to the broadcast command BCMD1. For another example, the broadcast commands BCMD1 and BCMD2 may be simultaneously transmitted to the memory device 100a. In this case, a bit (or logical value) of a specific signal of the broadcast command BCMD1 may indicate the start of the data movement, a bit (or logical value) of a specific signal of the broadcast command BCMD2 may indicate the end of the data movement, and the values of both bits may be different from each other.

The memory device 100a according to an example embodiment may support the data movement between the core dies 110 and 120 based on (or by using) the broadcast commands BCMD1 and BCMD2 issued or output from the external device. The external device may set the start and end of the data movement by adjusting the order of transmitting (or issuing or generating) the broadcast commands BCMD1 and BCMD2 or setting the values of the specific bits of the broadcast commands BCMD1 and BCMD2. Because the memory device 100a supports the data movement through the broadcast commands BCMD1 and BCMD2, the external device may execute (or accomplish) the data movement through the broadcast commands BCMD1 and BCMD2 without needing to read data from the core die 110 of the memory device 100a and transmit the read data to the core die 120 of the memory device 100a, for the data movement. Accordingly, a latency between the memory device 100a and the external device, which is caused due to the data movement, may be removed or decreased.

Figure 2:
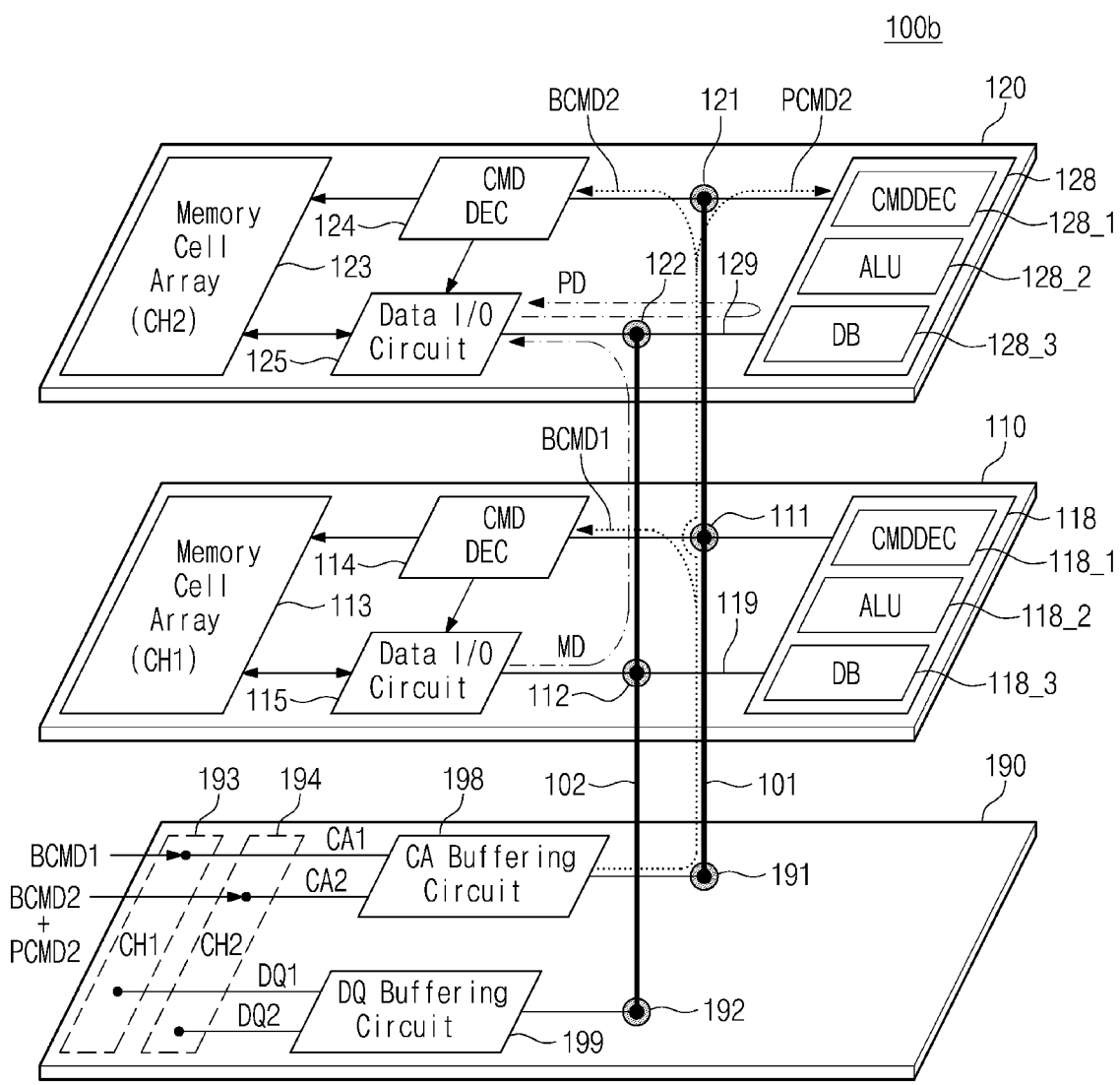

FIG. 2 illustrates a block diagram of a memory device according to another example embodiment. A difference between a memory device 100b and the memory device 100a will be mainly described, and additional description associated with components having the same reference numerals will be omitted to avoid redundancy. Also, in the case of describing other drawings, additional description associated with components having the same reference numerals will be omitted to avoid redundancy.

The processing circuit 118 may include a command decoder 118_1, an arithmetic logic block (ALU) 118_2, and a data buffer 118_3. As in the command decoder 114, the command decoder 118_1 may identify the ID of the channel CHL may decode the command and address signals CAL and may control the ALU 118_2 and the data buffer 118_3. The ALU 118_2 may execute various arithmetic or logic operations under control of the command decoder 118_1, such as addition, subtraction, multiplication, division, shift, AND, NAND, OR, NOR, XNOR, and XOR. The above operation may be also referred to as a "processing operation". The data buffer 118_3 may include a plurality of registers or latches. The data buffer 118_3 may store data of the internal data input/output bus 119 or the common data input/output bus 102, or intermediate or final data of the arithmetic logic operation executed by the ALU 118_2. The processing circuit 128 may include a command decoder 128_1, an ALU 128_2, and the data buffer 128_3 that operate to be similar to the components 118_1 to 118_3. As in the command decoder 124, the command decoder 128_1 may identify the ID of the channel CH2, may decode the command and address signals CA2, and may control the ALU 128_2 and the data buffer 128_3. For example, a processing operation that is executed by the ALU 118_2 may be identical to or different from a processing operation that is executed by the ALU 128_2.

The memory device 100b may further receive a processing command PCMD2. For example, the external device may further issue the processing command PCMD2, and the memory device 100b may receive the processing command PCMD2 after the broadcast commands BCMD1 and BCMD2. Compared to the case of the memory device 100a, the external device may further request the processing circuit 128 to perform the processing operation on moved data by issuing the broadcast commands BCMD1 and BCMD2 and then issuing the processing command PCMD2.

The command and address buffering circuit 198 may receive the processing command PCMD2 through the channel CH2 and the pins 194 and may output the processing command PCMD2 together with the ID of the channel CH2 to the common command and address bus 101. The command decoder 128_1 may identify the ID of the channel CH2 and may decode the processing command PCMD2. The data buffer 128_3 may store the data MD transmitted from the data input/output circuit 125 through the internal data input/output bus 129 or the common data input/output bus 102. The data MD may be data that have not yet been stored in the memory cell array 123, such as data received from the core die 110, or data that are stored in the memory cell array 123 and are then read from the memory cell array 123. The ALU 128_2 may execute a processing operation with respect to the data MD of the data buffer 128_3 to generate the data PD. The data buffer 128_3 may store data PD, and the data PD may be transmitted to the data input/output circuit 125 through the internal data input/output bus 129 or the common data input/output bus 102. The data input/output circuit 125 may transmit the data PD to the memory cell array 123 under control of the command decoder 124 decoding the broadcast command BCMD2 or may transmit the data PD to the memory cell array 123 under control of the command decoder 124 decoding both the broadcast command BCMD2 and the processing command PCMD2, and the data PD may be stored in the memory cell array 123. The data PD, not the data MD, may be stored in the memory cell array 123.

In an example embodiment, the processing command PCMD2 may be merged to the broadcast command BCMD2. The broadcast command BCMD2 may include information for requesting a processing operation of the processing circuit 128 on an end location, as well as an end and the end location of the data movement. The broadcast commands BCMD1 and BCMD2 may be distinguished from each other by the order of transmission or by a different bit value(s) of a specific signal(s) of the broadcast commands BCMD1 and BCMD2.

Figure 3:
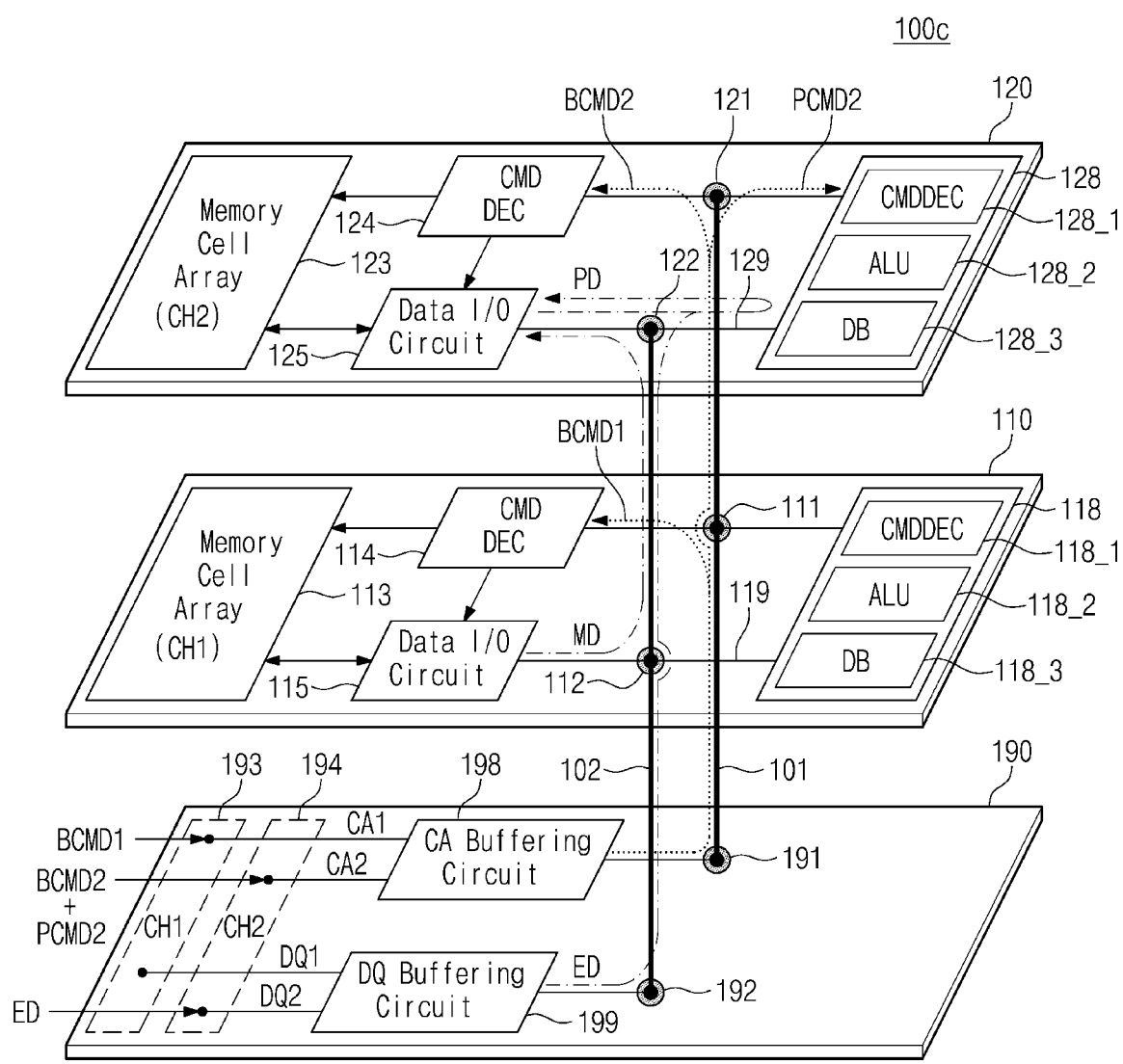

FIG. 3 illustrates a block diagram of a memory device according to another example embodiment. A difference between a memory device 100c and the memory device 100b will be mainly described. The external device may further generate external data ED. The data input/output buffering circuit 199 may receive the data input/output signals DQ2 including the external data ED through the channel CH2 and the pins 194 and may output the data input/output signals DQ2 including the external data ED to the common data input/output bus 102. The data buffer 128_3 may further receive and store the external data ED through the common data input/output bus 102. The ALU 128_2 may execute a processing operation with respect to the data MD and the external data ED to generate the data PD. The data PD may be transmitted to the memory cell array 123 by the data input/output circuit 125 under control of the command decoder 124 decoding the broadcast command BCMD2 or the processing command PCMD2. The external device may request the movement of the data MD from the core die 110 to the core die 120 and the processing operation of the data MD and the external data ED, by further inputting the external data ED to the memory device 100c. The external data ED may be based on the processing command PCMD2 or the broadcast command BCMD2.

Figure 4:
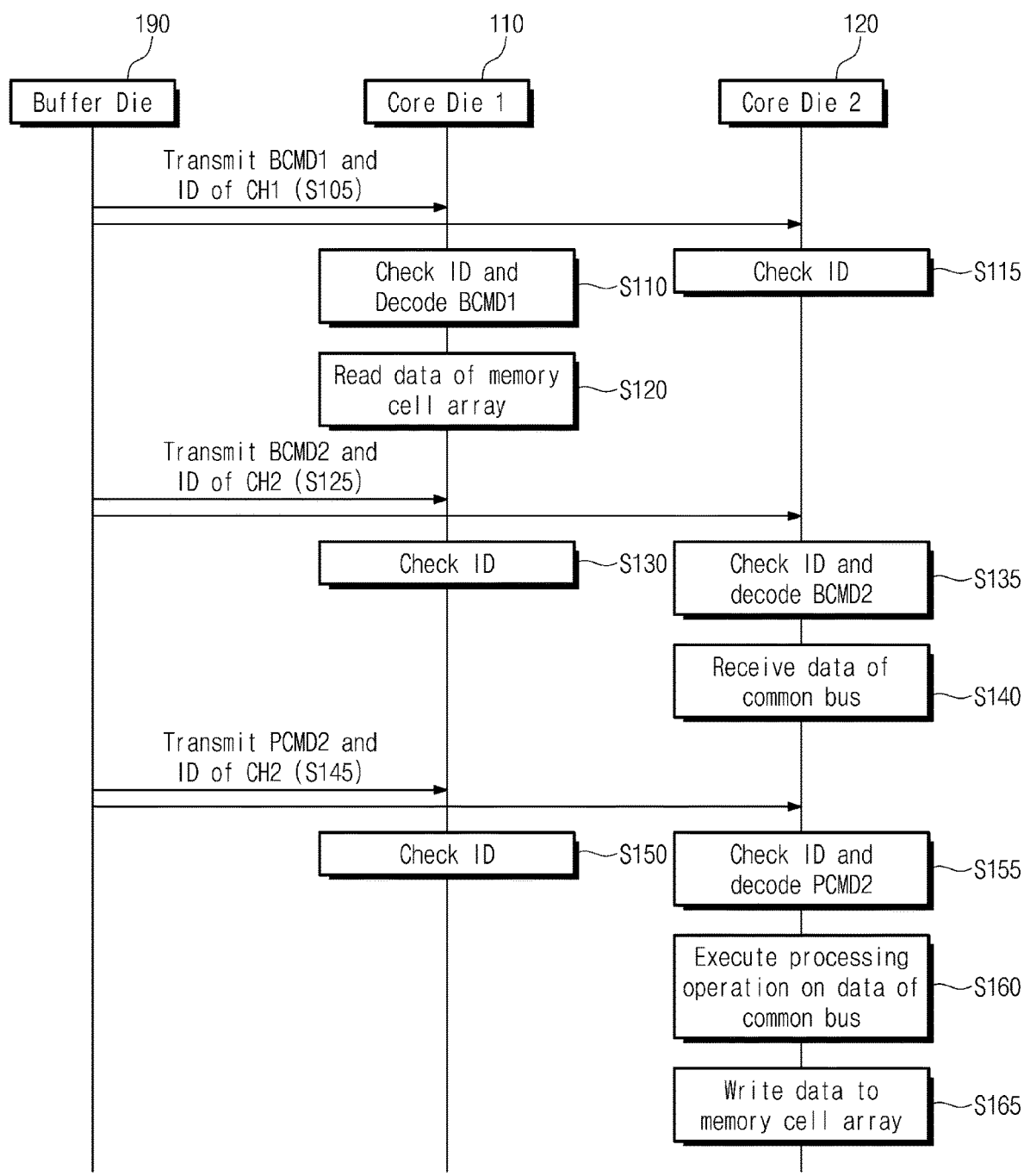
FIG. 4 is a flowchart illustrating an operation method of memory devices according to an example embodiment.

FIG. 4 is a flowchart illustrating an operating method of memory devices of FIGS. 1 to 3. The flowchart of FIG. 4 may be applied to the memory devices 100a to 100c. In operation S105, the command and address buffering circuit 198 of the buffer die 190 may output the broadcast command BCMD1 and the ID of the channel CH1 received through the channel CH1 to the common command and address bus 101. In operation S110, the command decoder 114 of the core die 110 may check the ID associated with the broadcast command BCMD1, may identify the ID of the channel CH1 and may decode the broadcast command BCMD1. In operation S115, the command decoder 124 of the core die 120 may check the ID associated with the broadcast command BCMD1, may identify the ID of the channel CH1 and may not decode the broadcast command BCMD1. For example, each of the command decoders 114 and 124 may compare the previously programmed or stored ID of each of the channels CH1 and CH2 and the ID transmitted through the common command and address bus 101 and may decode a command depending on whether the IDs are matched. In operation S120, under control of the command decoder 114, data stored in the memory cell array 113 may be read, and the data input/output circuit 115 may output the data MD to the common data input/output bus 102.

In operation S125, the command and address buffering circuit 198 of the buffer die 190 may output the broadcast command BCMD2 and the ID of the channel CH2 received through the channel CH2 to the common command and address bus 101. In operation S130, the command decoder 114 of the core die 110 may check the ID associated with the broadcast command BCMD2, may identify the ID of the channel CH2 and may not decode the broadcast command BCMD2. In operation S135, the command decoder 124 of the core die 120 may check the ID associated with the broadcast command BCMD2, may identify the ID of the channel CH2 and may decode the broadcast command BCMD2. For example, while the data MD are output from the memory cell array 113 to the common data input/output bus 102 in operation S120, operation S125 to operation S135 may be performed. In operation S140, the data input/output circuit 125 of the core die 120 may receive the data MD of the common data input/output bus 102. Depending on a next command (e.g., the processing command PCMD2) or the broadcast command BCMD2, the data input/output circuit 125 may transmit the data MD or the data PD being a result of executing the processing operation of the processing circuit 128 on the data MD.

In operation S145, the command and address buffering circuit 198 of the buffer die 190 may output the processing command PCMD2 and the ID of the channel CH2 received through the channel CH2 to the common command and address bus 101. In operation S150, the command decoder 118_1 of the core die 110 may check the ID associated with the processing command PCMD2, may identify the ID of the channel CH2 and may not decode the processing command PCMD2. In operation S155, the command decoder 128_1 of the core die 120 may check the ID associated with the processing command PCMD2, may identify the ID of the channel CH2 and may decode the processing command PCMD2. In operation S160, the ALU 128_2 may execute the processing operation on the data MD of the internal data input/output bus 129 or data of the common data input/output bus 102. When the data input/output buffering circuit 199 of the buffer die 190 receives the external data ED through the channel CH2, the ALU 128_2 may execute the processing operation on the data MD and the external data ED of the common data input/output bus 102. In operation S165, the data input/output circuit 125 may transmit the data PD to the memory cell array 123, and the data PD may be written to the memory cell array 123.

In an example embodiment, an operation mode of the memory device 100a/100b/100c may be classified as a normal mode or a processing mode (or a broadcast mode). The external device may transmit, to the memory device 100a/100b/100c, normal commands (e.g., an active command, a precharge command, a read command, and a write command) for writing data to the memory device 100a/100b/100c or reading data from the memory device 100a/100b/100c, and the memory device 100a/100b/100c may operate in the normal mode. The external device may transmit, to the memory device 100a/100b/100c, a broadcast command or a processing command for requesting processing operations supported by the processing circuit 118/128 of the memory device 100a/100b/100c, and the memory device 100a/100b/100c may operate in the processing mode, not in the normal mode. The processing mode and the normal mode may be distinguished from each other depending on a kind of a command transmitted to the memory device 100a/100b/100c.

Figure 5:
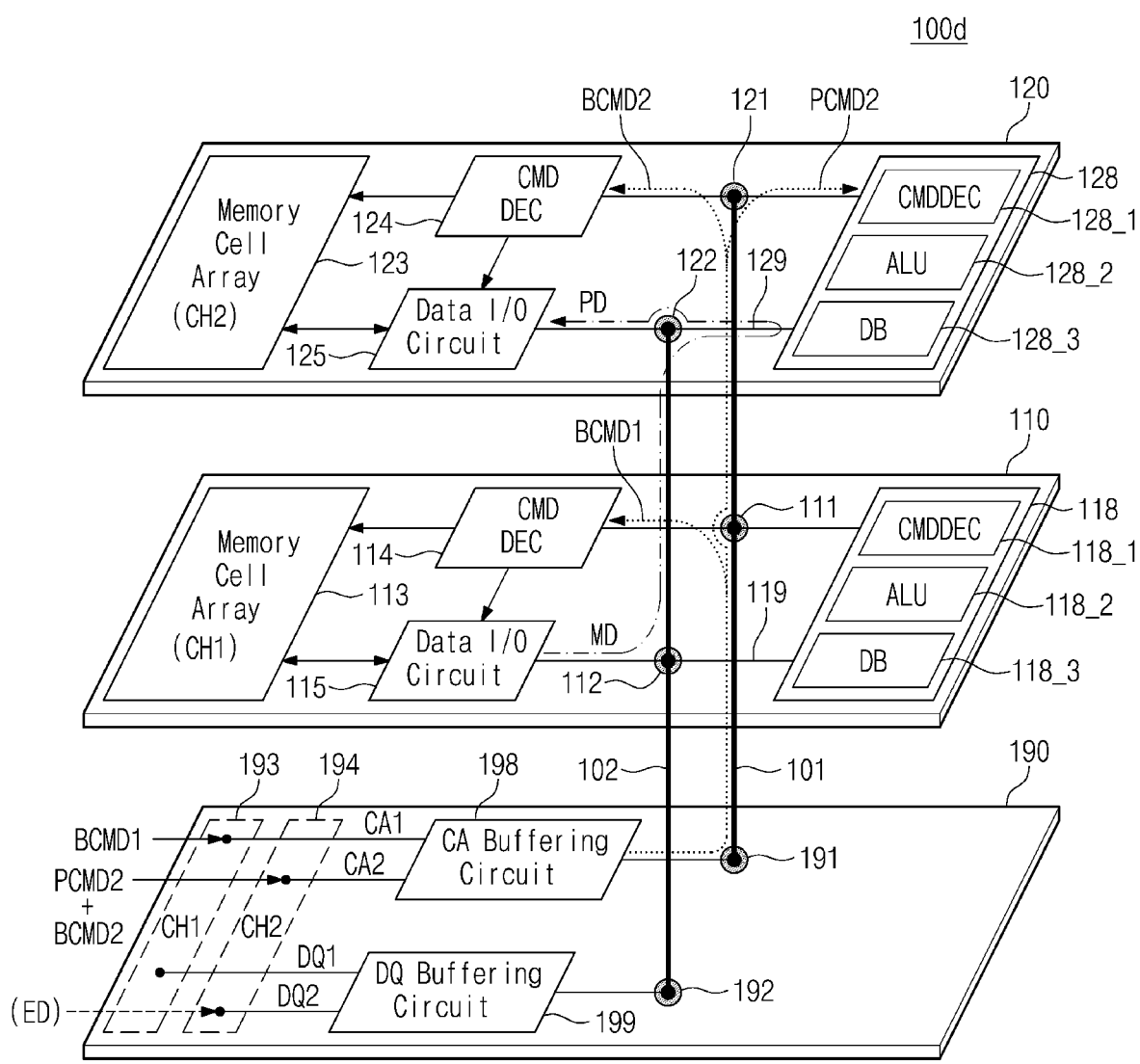
FIGS. 5 to 7 illustrate block diagrams of memory devices according to example embodiments.

FIG. 5 illustrates a block diagram of a memory device according to another example embodiment. A difference between a memory device 100d and the memory device 100b/100c will be mainly described. The memory device 100b/100c may receive the processing command PCMD2 after the broadcast commands BCMD1 and BCMD2. The command and address buffering circuit 198 of the memory device 100d may receive the broadcast command BCMD1 through the channel CH1 and the pins 193, may then receive the processing command PCMD2 through the channel CH2 and the pins 194, and may then receive the broadcast command BCMD2 through the channel CH2 and the pins 194. In one example embodiment, unlike the example illustrated in FIG. 5, the processing command PCMD2 may be included in the broadcast command BCMD2. The command and address buffering circuit 198 may output the broadcast command BCMD1 and the ID of the channel CH1, the processing command PCMD2 and the ID of the channel CH2, and the broadcast command BCMD2 and the ID of the channel CH2 to the common command and address bus 101. The data input/output circuit 115 may output the data MD to the common data input/output bus 102 under control of the command decoder 114 decoding the broadcast command BCMD1, the ALU 128_2 may execute the processing operation on the data MD of the common data input/output bus 102 under control of the command decoder 128_1 decoding the processing command PCMD2, the data buffer 128_3 may output the data PD to the common data input/output bus 102 or the internal data input/output bus 129, and the data input/output circuit 125 may receive the data PD under control of the command decoder 124 decoding the broadcast command BCMD2. The data input/output buffering circuit 199 of the memory device 100d may further receive the external data ED through the channel CH2 and the pins 194, and the ALU 128_2 may execute the processing operation on the data MD and the external data ED to generate the data PD.

Figure 6:
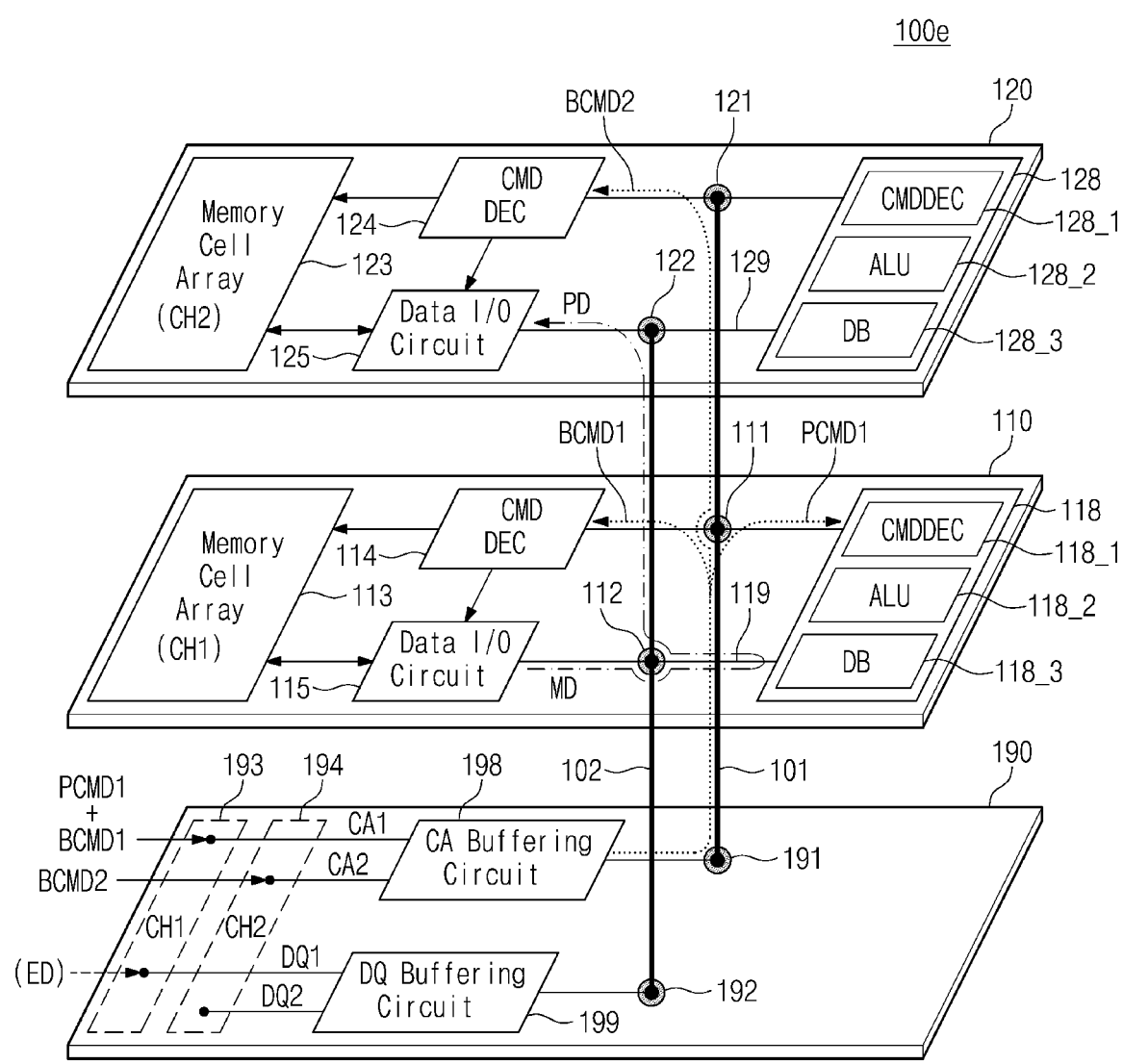

FIG. 6 illustrates a block diagram of a memory device according to another example embodiment. A difference between a memory device 100e and the memory device 100d will be mainly described. The command and address buffering circuit 198 of the memory device 100e may receive the broadcast command BCMD1 through the channel CH1 and the pins 193, may then receive a processing command PCMD1 through the channel CH1 and the pins 193, and may then receive the broadcast command BCMD2 through the channel CH2 and the pins 194. In one example embodiment, unlike the example illustrated in FIG. 6, the processing command PCMD1 may be included in the broadcast command BCMD1. The command and address buffering circuit 198 may output the broadcast command BCMD1 and the ID of the channel CH1, the processing command PCMD1 and the ID of the channel CH1, and the broadcast command BCMD2 and the ID of the channel CH2 to the common command and address bus 101. The data input/output circuit 115 may output the data MD to the common data input/output bus 102 under control of the command decoder 114 decoding the broadcast command BCMD1, the ALU 118_2 may execute the processing operation on the data MD of the common data input/output bus 102 under control of the command decoder 118_1 decoding the processing command PCMD1, the data buffer 118_3 may output the data PD to the common data input/output bus 102, and the data input/output circuit 125 may receive the data PD of the common data input/output bus 102 under control of the command decoder 124 decoding the broadcast command BCMD2. The data input/output buffering circuit 199 of the memory device 100e may further receive the external data ED through the channel CH1 and the pins 193, and the ALU 118_2 may execute the processing operation on the data MD and the external data ED to generate the data PD.

Figure 7:
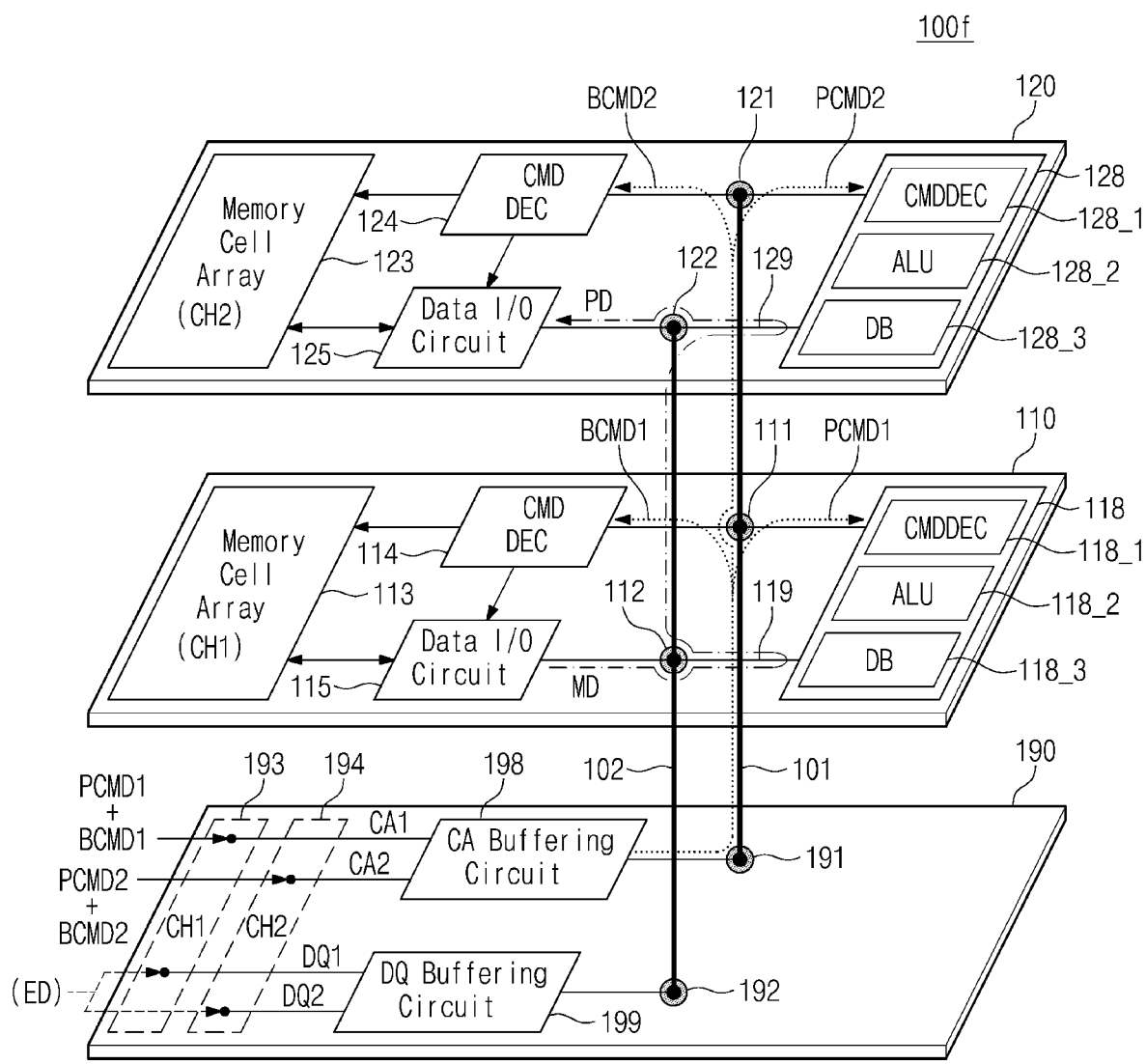

FIG. 7 illustrates a block diagram of a memory device according to another example embodiment. A difference between a memory device 100f and the memory device 100d/100e will be mainly described.

The command and address buffering circuit 198 of the memory device 100f may receive the broadcast command BCMD1 through the channel CH1 and the pins 193, may then receive the processing command PCMD1 through the channel CH1 and the pins 193, may then receive the processing command PCMD2 through the channel CH2 and the pins 194, and may then receive the broadcast command BCMD2 through the channel CH2 and the pins 194. In one example embodiment, unlike the examples illustrated in FIG. 7, the processing command PCMD1 may be included in the broadcast command BCMD1 and the processing command PCMD2 may be included in the broadcast command BCMD2. The command and address buffering circuit 198 may output the broadcast command BCMD1 and the ID of the channel CH1, the processing command PCMD1 and the ID of the channel CH1, the processing command PCMD2 and the ID of the channel CH2, and the broadcast command BCMD2 and the ID of the channel CH2 to the common command and address bus 101. The data input/output circuit 115 may output the data MD to the common data input/output bus 102 under control of the command decoder 114 decoding the broadcast command BCMD1, the ALU 118_2 may execute the processing operation on the data MD of the common data input/output bus 102 under control of the command decoder 118_1 decoding the processing command PCMD1, the data buffer 118_3 may output the data PD to the common data input/output bus 102, the ALU 128_2 may execute the processing operation on the data PD of the common data input/output bus 102 under control of the command decoder 128_1 decoding the processing command PCMD2, the data buffer 128_3 may output the data PD to the common data input/output bus 102 or the internal data input/output bus 129, and the data input/output circuit 125 may receive the data PD under control of the command decoder 124 decoding the broadcast command BCMD2. The data input/output buffering circuit 199 of the memory device 100f may further receive the external data ED through the channel CH1 and the pins 193 or may receive the external data ED through the channel CH2 and the pins 194; the ALU 118_2 may execute the processing operation on the data MD and the external data ED to generate the data PD, or the ALU 128_2 may execute the processing operation on the data MD and the external data ED to generate the data PD.

Figure 8:
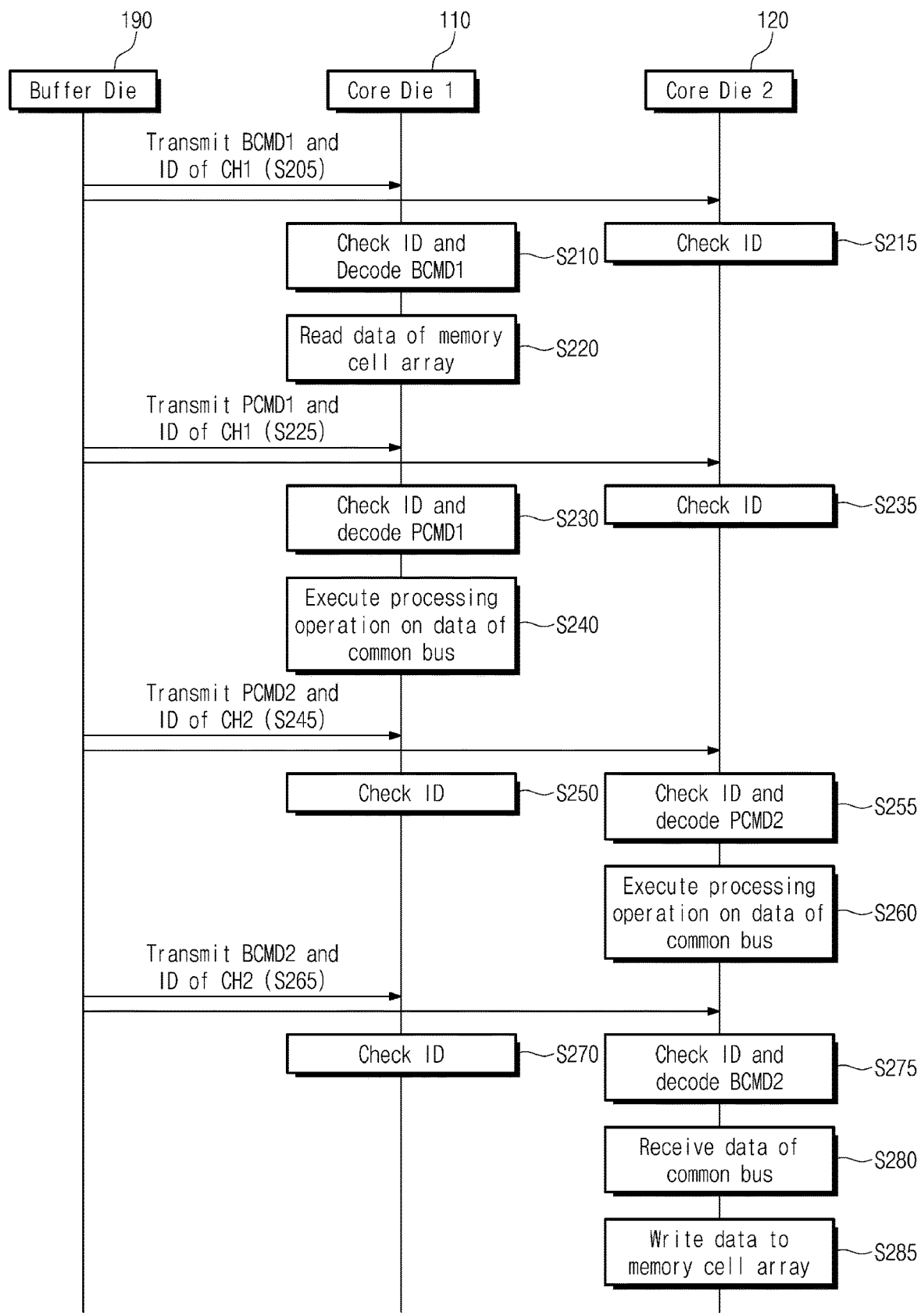
FIG. 8 is a flowchart illustrating an operation method of a memory device according to an example embodiment.

FIG. 8 is a flowchart illustrating an operation method of a memory device of FIG. 7. The flowchart of FIG. 8 may be applied to the memory devices 100d to 100f. Operation S205 to operation S220 are substantially the same as operation S105 to operation S120. Operation S225 to operation S240 are substantially identical to operation S145 to operation S160 except that operation S225 to operation S240 relate to the channel CH1. Operation S245 to operation S260 are substantially identical to operation S145 to operation S160. Operation S265 to operation S285 are substantially identical to operation S125 to operation S140 and operation S165.

Figure 9:
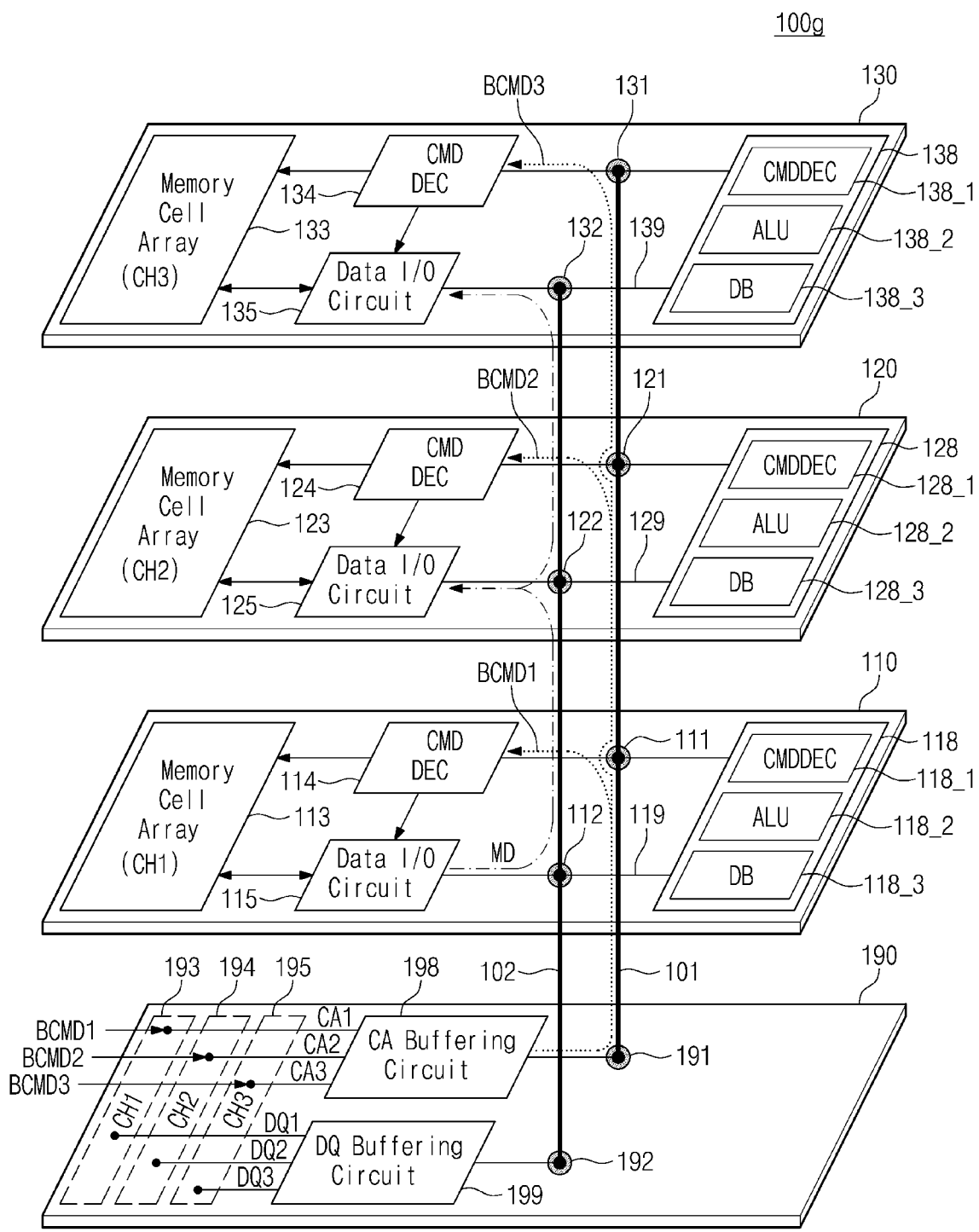
FIGS. 9 and 10 illustrate block diagrams of memory devices according to example embodiments.

FIG. 9 illustrates a block diagram of a memory device according to another example embodiment. A difference between a memory device 100g and the memory device 100a will be mainly described.

The memory device 100g may further include a core die 130. The core die 130 may include TSVs 131 and 132, a memory cell array 133, a command decoder 134, a data input/output circuit 135, a processing circuit 138, and an internal data input/output bus 139. The core die 130 may be stacked on the core die 120. As in the channels CH1 and CH2, a channel CH3 may include access (or communication) paths capable of accessing the memory device 100g and may be independent of the channels CH1 and CH2. The external device may access the memory cell array 133 or the processing circuit 138 through the channel CH3. Operations of the components 133 to 139 of the core die 130 may be similar or substantially identical to the operations of the components 113 to 119/123 to 129 of the core die 110/120 except that the core die 130 is accessible through the channel CH3 and the core die 110/120 is accessible through the channel CH1/CH2.

The buffer die 190 may further include pins 195. The pins 195 may be implemented to be substantially identical to the pins 193 except that the pins 195 are allocated to the channel CH3. As in the command and address signals CA1/CA2, the command and address buffering circuit 198 may output command and address signals CA3 to the common command and address bus 101. As in the data input/output signals DQ1/DQ2, the data input/output buffering circuit 199 may transmit data input/output signals DQ3.

The memory device 100g may further receive a broadcast command BCMD3 from the external device through the channel CH3. For example, the broadcast command BCMD3 may be transmitted to the memory device 100g together with the broadcast command BCMD2 after the broadcast command BCMD1 or may be transmitted to the memory device 100g after the broadcast command BCMD2. Alternatively, the broadcast command BCMD3 may be transmitted after the broadcast command BCMD1, and then, the broadcast command BCMD2 may be transmitted. The broadcast commands BCMD1, BCMD2, and BCMD3 may request the movement of data from the memory cell array 113 allocated to the channel CH1 to the memory cell arrays 123 and 133 respectively allocated to the channels CH2 and CH3. For example, the broadcast command BCMD3 transmitted to the memory device 100g through the channel CH3 may indicate an end and an end location of the data movement (i.e., the memory cell array 133 allocated to the channel CH3). For example, the number of memory cell arrays or channels corresponding to the end location may be one or more. Also, a processing command may be further merged to the broadcast command BCMD3.

After operations of the command and address buffering circuit 198, the memory cell array 113, the command decoder 114, and the data input/output circuit 115, which are performed in response to the broadcast command BCMD1, are completed, the data MD may be output to the common data input/output bus 102. After operations of the command and address buffering circuit 198, the memory cell array 123, the command decoder 124, and the data input/output circuit 125, which are performed in response to the broadcast command BCMD2, are completed, the data input/output circuit 125 may receive the data MD of the common data input/output bus 102. As in the operations of the command and address buffering circuit 198, the memory cell array 123, the command decoder 124, and the data input/output circuit 125, which are performed in response to the broadcast command BCMD2, operations of the command and address buffering circuit 198, the memory cell array 133, the command decoder 134, and the data input/output circuit 135, which are performed in response to the broadcast command BCMD3, are completed, the data input/output circuit 135 may receive the data MD of the common data input/output bus 102.

For example, the command and address buffering circuit 198 may output the command and address signals CA1 including the broadcast command BCMD1 to the common command and address bus 101, may then output the command and address signals CA2 including the broadcast command BCMD2 to the common command and address bus 101, and may then output the command and address signals CA3 including the broadcast command BCMD3 to the common command and address bus 101. The data input/output circuit 125 may receive the data MD of the common data input/output bus 102 before the data input/output circuit 135. For another example, the command and address buffering circuit 198 may output the command and address signals CA3 including the broadcast command BCMD3 to the common command and address bus 101 before the command and address signals CA2 including the broadcast command BCMD2. The data input/output circuit 135 may receive the data MD of the common data input/output bus 102 before the data input/output circuit 125.

Figure 10:
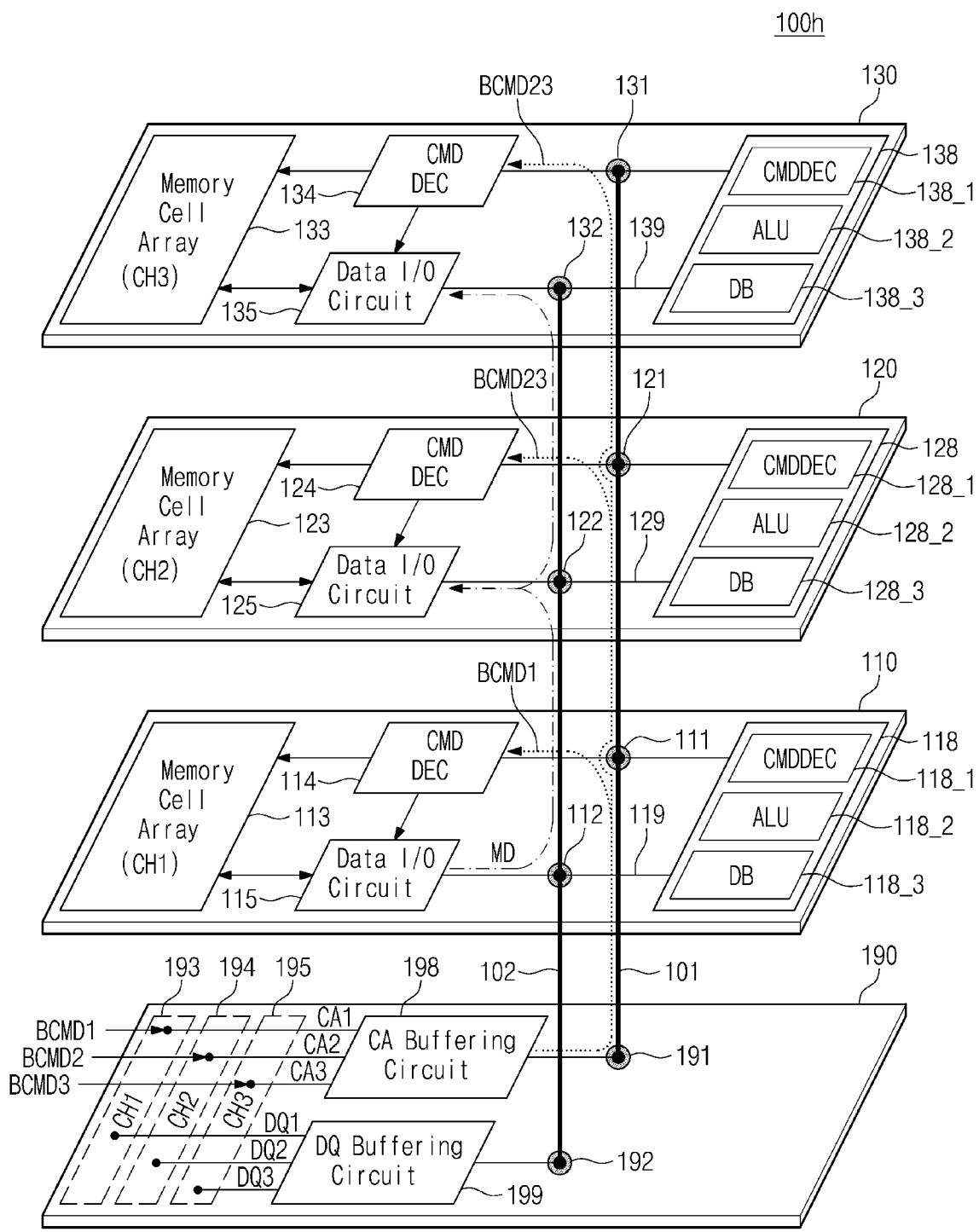

FIG. 10 illustrates a block diagram of a memory device according to another example embodiment. A difference between a memory device 100h and the memory device 100g will be mainly described.

The command and address buffering circuit 198 may output the command and address signals CA1 including the broadcast command BCMD1 to the common command and address bus 101 and may output a command and address signals, to which the broadcast command BCMD2 and the broadcast command BCMD3 are merged, to the common command and address bus 101. Logical values of the command and address signals CA2 and CA3 respectively indicating the broadcast commands BCMD2 and BCMD3 may be identical. The command and address buffering circuit 198 may merge the broadcast commands BCMD2 and BCMD3 and may output the merged broadcast command having the same logical values to the common command and address bus 101. The command and address buffering circuit 198 may merge IDs of the channels CH2 and CH3 or may set, to "Don't care", a specific bit capable of identifying the channels CH2 and CH3 from among bits of the IDs of the channels CH2 and CH3. The command and address buffering circuit 198 may output the merged ID simultaneously indicating the channels CH2 and CH3 to the common command and address bus 101, together with the merged broadcast command. Accordingly, the command decoders 124 and 134 may simultaneously decode the merged broadcast command, and the data input/output circuits 125 and 135 may simultaneously receive the data MD of the common data input/output bus 102.

Figure 11:
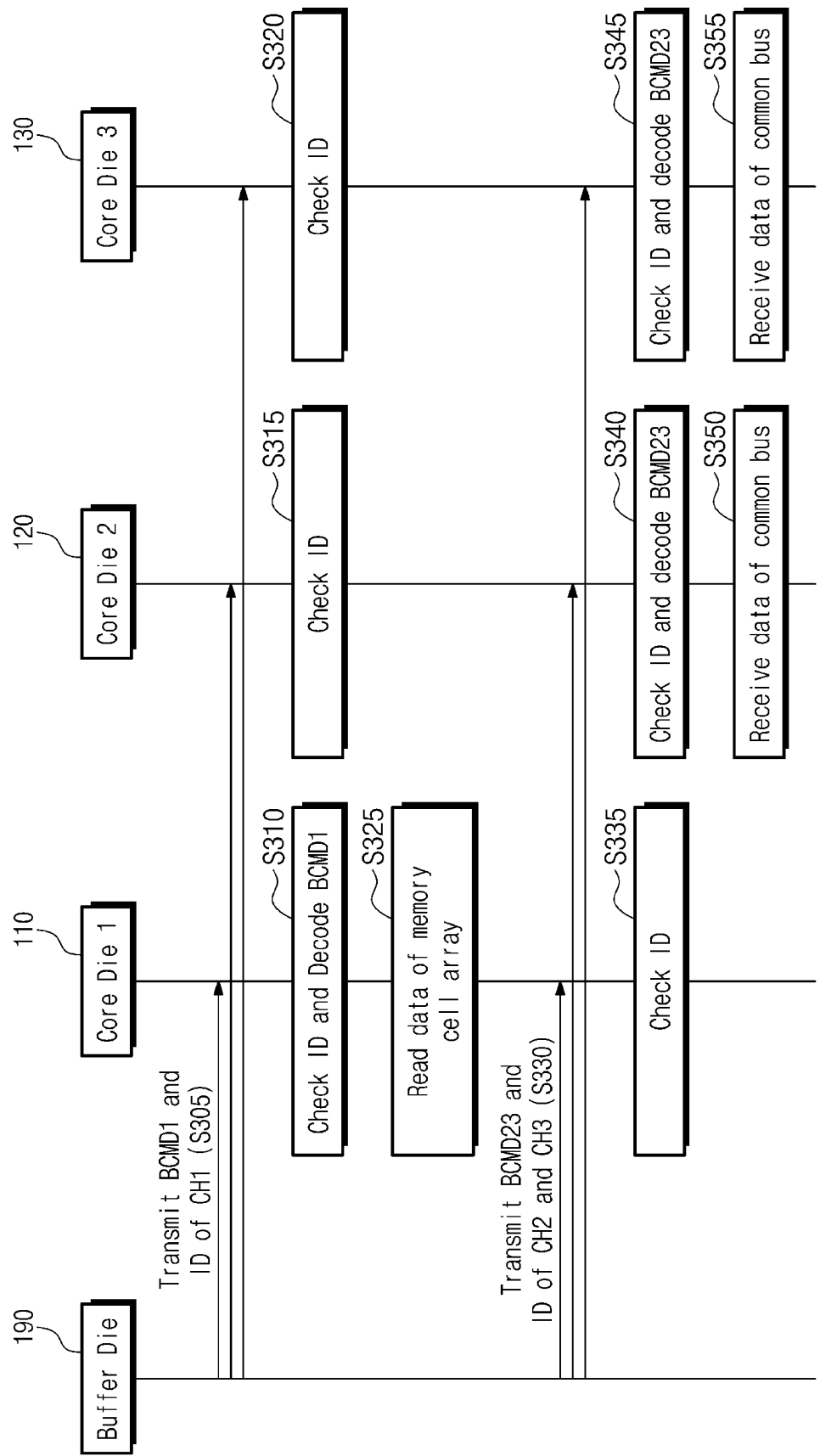
FIG. 11 is a flowchart illustrating an operation method of a memory device according to an example embodiment.

FIG. 11 is a flowchart illustrating an operation method of a memory device of FIG. 10. The flowchart of FIG. 11 may be applied to the memory devices 100g and 100h. Operation S305, operation S310, and operation S325 may be substantially identical to operation S105, operation S110, and operation S120. Each of operation S315 and operation S320 may be substantially identical to operation S115. In operation S330, the command and address buffering circuit 198 of the buffer die 190 may merge the broadcast commands BCMD2 and BCMD3 received through the channels CH2 and CH3 and may output a merged broadcast command BCMD23 and a merged ID indicating the channels CH2 and CH3 to the common command and address bus 101. Operation S335 may be substantially identical to operation S150. Operation S340 and operation S350 may be substantially identical to operation S135 and operation S140. Operation S345 and operation S355 may be substantially identical to operation S135 and operation S140.

In an example embodiment, the memory device 100g/100h may further receive a processing command in addition to the broadcast commands BCMD1 to BCMD3. For example, as described with reference to FIGS. 2 to 4, the processing command may be transmitted to the memory device 100g/100h after the broadcast commands BCMD1 to BCMD3. For another example, as described with reference to FIGS. 5 to 8, the processing command may be transmitted to the memory device 100g/100h after the broadcast command BCMD1 is transmitted and before the broadcast commands BCMD2 and BCMD3 are transmitted. The processing command may request one of the processing circuits 118 to 138 to perform a processing operation on the data MD of the common data input/output bus 102 or the data PD being a result of a processing operation performed by another of the processing circuits 118 to 138. Two or more processing commands may be transmitted to the memory device 100g/100h, and the processing commands may request two or more of the processing circuits 118 to 138 of the core dies 110 to 130 to perform processing operations on the data MD or the data PD of the common data input/output bus 102. Also, as described with reference to FIGS. 5 to 8, the external data ED may be further transmitted to the memory device 100g/100h together with the processing command. The processing command may request one of the processing circuits 118 to 138 of the core dies 110 to 130 to perform a processing operation on the data MD, the data PD, or the external data ED of the common data input/output bus 102. Example embodiments are not limited to those described with reference to FIGS. 1 to 11. For example, the number of core dies stacked on the buffer die 190 may be one or more. For example, a start location of the data movement may be another memory cell array allocated to another channel without limitation to the memory cell array 113 allocated to the channel CH1, and an end location of the data movement may be one or more memory cell arrays. For example, one or more processing commands may be transmitted to the buffer die 190 together with broadcast commands or may be included in broadcast commands, one or more processing operations may be performed on the data MD/PD of the common data input/output bus 102 or the external data ED.

Figure 12:
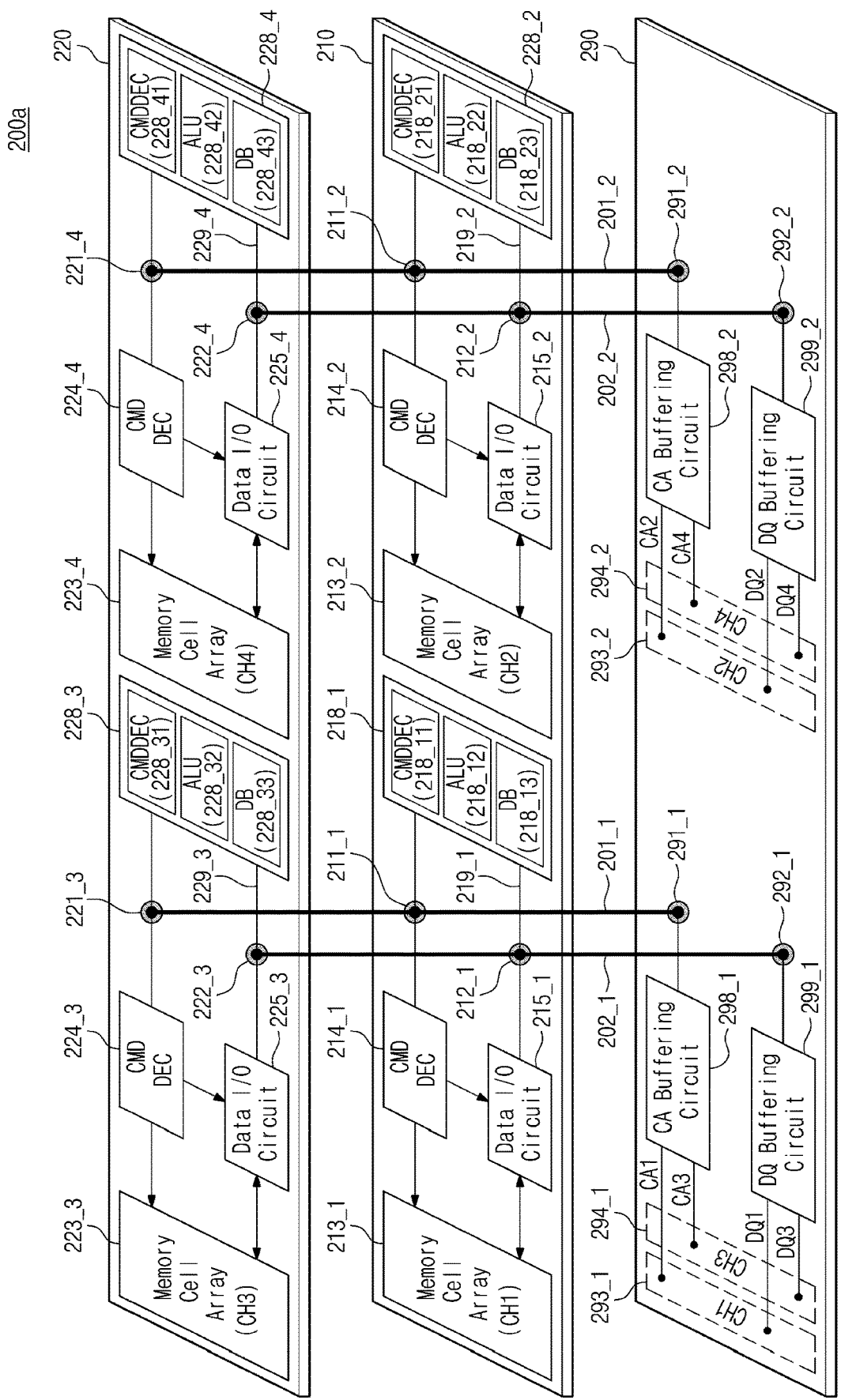
FIGS. 12 and 13 illustrate block diagrams of memory devices according to example embodiments.

FIG. 12 illustrates a block diagram of a memory device according to another example embodiment. A difference between a memory device 200a and the memory device 100b will be mainly described. The memory device 200a may include core dies 210 and 220 and a buffer die 290.

Each of the core dies 110 to 130 of the memory devices 100a to 100h described above may be allocated to one channel, but each of the core dies 210 and 220 may be allocated to two channels. Of course, each of the core dies 210 and 220 may be allocated to two or more channels.

The core die 210 may include TSVs 211_1 and 212_1, a memory cell array 213_1, a command decoder 214_1, a data input/output circuit 215_1, a processing circuit 218_1 including a command decoder 218_11, an ALU 218_12, and a data buffer 218_13, and an internal data input/output bus 219_1. The components 211_1 to 219_1 may be allocated to the channel CH1 so as to be accessed through the channel CH1 and may be implemented to be identical to the components 111 to 119 of the memory devices 100a to 100h. The core die 210 may further include TSVs 211_1 and 212_1, a memory cell array 213_2, a command decoder 214_2, a data input/output circuit 215_2, a processing circuit 218_2 including a command decoder 218_21, an ALU 218_22, and a data buffer 218_23, and an internal data input/output bus 219_2. The components 211_2 to 219_2 may be allocated to the channel CH2 so as to be accessed through the channel CH2 and may be implemented to be identical to the components 111 to 119 of the memory devices 100a to 100h.

The core die 220 may include TSVs 221_3 and 222_3, a memory cell array 223_3, a command decoder 224_3, a data input/output circuit 225_3, a processing circuit 228_3 including a command decoder 228_31, an ALU 228_32, and a data buffer 228_33, and an internal data input/output bus 229_3. The components 221_3 to 229_3 may be allocated to the channel CH3 so as to be accessed through the channel CH3 and may be implemented to be identical to the components 111 to 119 of the memory devices 100a to 100h. The core die 220 may further include TSVs 221_4 and 222_4, a memory cell array 223_4, a command decoder 224_4, a data input/output circuit 225_4, a processing circuit 228_4 including a command decoder 228_41, an ALU 228_42, and a data buffer 228_43, and an internal data input/output bus 229_4. The components 221_4 to 229_4 may be allocated to the channel CH4 so as to be accessed through the channel CH4 and may be implemented to be identical to the components 111 to 119 of the memory devices 100a to 100h.

The buffer die 290 may include TSVs 291_1 and 292_1, pins 293_1 and 294_1, a command and address buffering circuit 298_1 and a data input/output buffering circuit 299_1. The components 291_1 to 294_1, 298_1, and 299_1 may be allocated to the channels CH1 and CH3 and may be implemented to be identical to the components 191 to 199 of the memory devices 100a to 100h. The buffer die 290 may further include TSVs 291_2 and 292_2, pins 293_2 and 294_2, a command and address buffering circuit 298_2 and a data input/output buffering circuit 299_2. The components 291_2 to 294_2, 298_2 and 299_2 may be allocated to the channels CH2 and CH4 and may be implemented to be identical to the components 191 to 199 of the memory devices 100a to 100h. For example, unlike the example illustrated in FIG. 12, the command and address buffering circuits 298_1 and 298_2 may be merged to one circuit, and the data input/output buffering circuits 299_1 and 299_2 may also be merged to one circuit.

The memory device 200a may include a common command and address bus 201_1 being common to the channels CH1 and CH3, a common command and address bus 201_2 being common to the channels CH2 and CH4, a common data input/output bus 202_1 being common to the channels CH1 and CH3, and a common data input/output bus 202_2 being common to the channels CH2 and CH4. The external device may transmit broadcast commands for requesting the data movement between the memory cell arrays 213_1 and 223_3 allocated to the channels CH1 and CH3 to the memory device 200a and may transmit broadcast commands for requesting the data movement between the memory cell arrays 213_2 and 223_4 allocated to the channels CH2 and CH4 to the memory device 200a. The external device may transmit a processing command(s) for requesting a processing operation(s) on the data MD, the data PD, or the external data ED by the movement between the memory cell arrays 213_1 and 223_3 allocated to the channels CH1 and CH3 to the memory device 200a through at least one of the channels CH1 and CH3 and may transmit a processing command(s) for requesting a processing operation(s) on the data MD, the data PD, or the external data ED by the movement between the memory cell arrays 213_2 and 223_4 allocated to the channels CH2 and CH4 to the memory device 200a through at least one of the channels CH2 and CH4. As in the memory devices 100g and 100h, the memory device 200a may further include another core die that is stacked on the core die 220, is implemented to be identical to the core dies 210 and 220, and is allocated to channels CH5 and CH6. In an example embodiment, processing operations that are executed by the ALUs 218_12 and 228_32 may be identical to or different from each other. Processing operations that are executed by the ALUs 218_22 and 228_42 may be identical to or different from each other. Processing operations that are executed by the ALUs 218_12 and 218_22 may be identical to or different from each other. Processing operations that are executed by the ALUs 228_32 and 228_42 may be identical to or different from each other.

Figure 13:
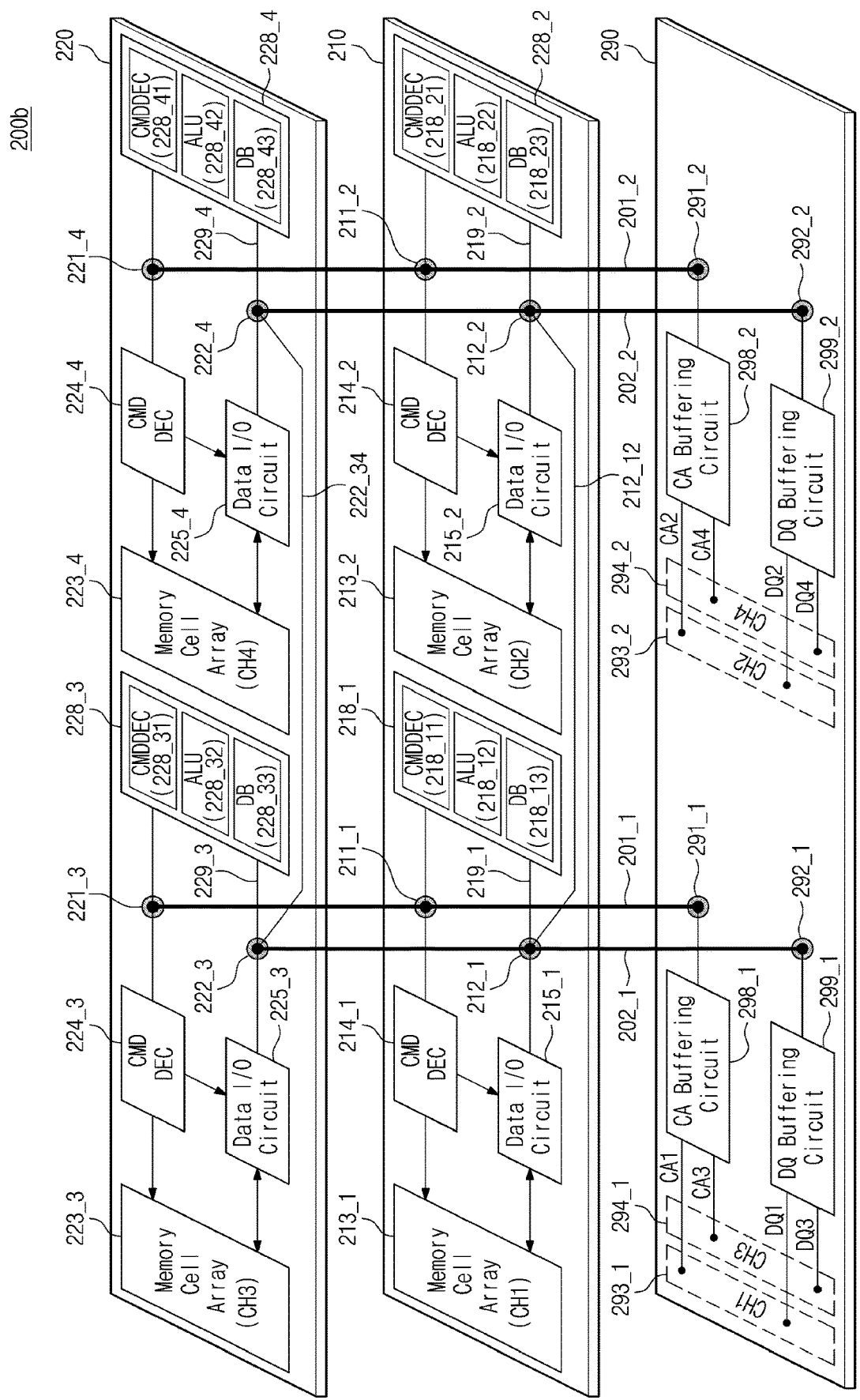

FIG. 13 illustrates a block diagram of a memory device according to another example embodiment. A difference between a memory device 200b and the memory device 200a will be mainly described. The core die 210 may further include a common data input/output bus 212_12 that electrically connects the common data input/output buses 202_1 and 202_2 and is common to the channels CH1 and CH2. For example, the internal data input/output bus 212_12 may be electrically connected to the TSVs 212_1 and 212_2 and with the internal data input/output buses 219_1 and 219_2. The core die 220 may further include a common data input/output bus 222_34 that electrically connects the common data input/output buses 202_1 and 202_2 and is common to the channels CH3 and CH4. For example, the internal data input/output bus 222_34 may be electrically connected to the TSVs 222_3 and 222_4 and with the internal data input/output buses 229_3 and 229_4. Compared with the memory device 200a, the memory device 200b may further include the common data input/output bus 212_12 and 222_34, and thus, the memory device 200b may further support the data movement between the channels CH1 and CH2, between the channels CH1 and CH4, between the channels CH3 and CH4, and between the channels CH3 and CH2, in addition to the data movement between the channels CH1 and CH3 and between the channels CH2 and CH4. The external device may transmit broadcast commands for requesting the data movement between the memory cell arrays 213_1, 213_2, 223_3, and 223_4 allocated to the channels CH1 to CH4 to the memory device 200b through the channels CH1 to CH4. The external device may transmit a processing command(s) for requesting a processing operation(s) on the data MD, the data PD, or the external data ED by the movement between the memory cell arrays 213_1, 213_2, 223_3, and 223_4 allocated to the channels CH1 to CH4 to the memory device 200b through at least one of the channels CH1 to CH4. Also, as in the memory devices 100g and 100h, the memory device 200b may further include another core die that is stacked on the core die 220, is implemented to be identical to the core dies 210 and 220, and is allocated to the channels CH5 and CH6.

Figure 14:
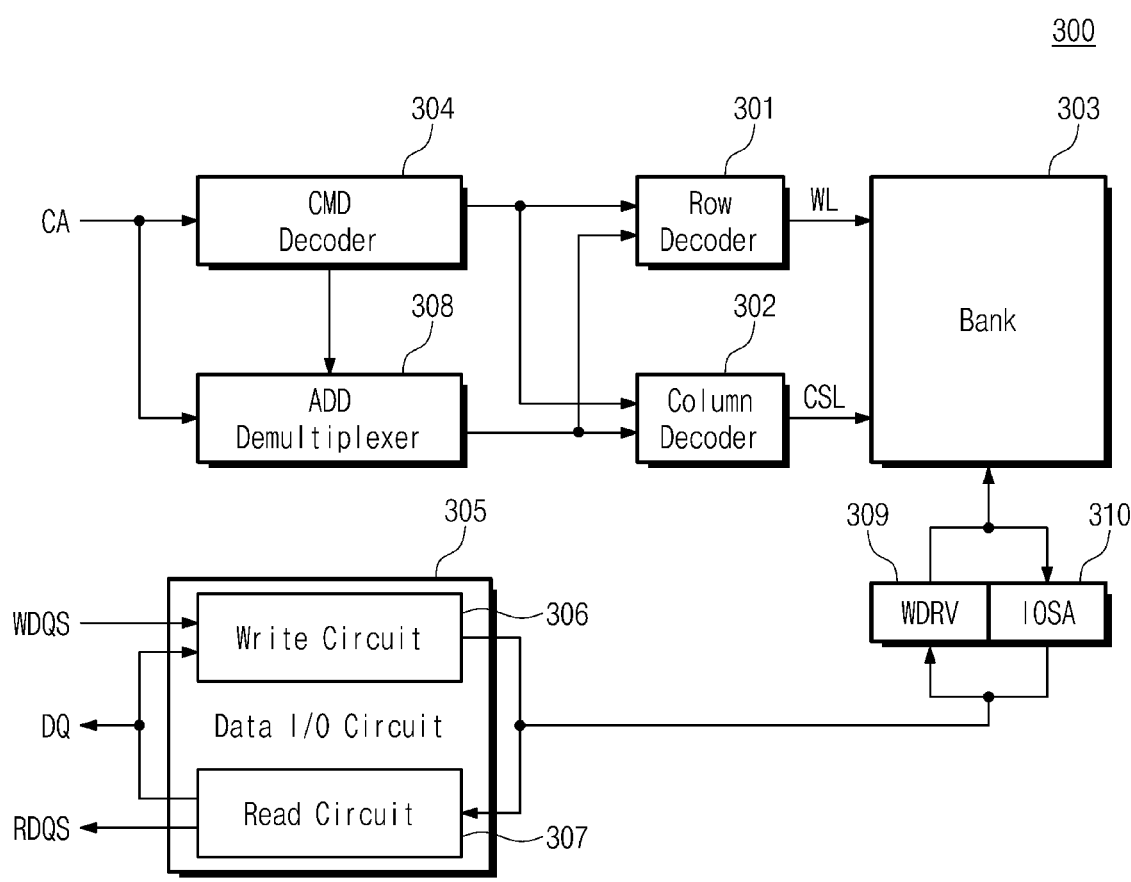
FIG. 14 illustrates a block diagram of a memory area of a core die included in a memory device according to an example embodiment.

FIG. 14 illustrates a block diagram of a memory area of a core die included in a memory device according to an example embodiment. A memory area 300 may indicate the remaining area other than processing areas where the processing circuits 118 to 138, 218_1, 218_2, 228_3, and 228_4 of the core dies 110 to 130 and 210 to 220 are disposed and TSV areas where the TSVs 111, 112, 121, 122, 211_1, 212_1, 211_2, 212_2, 221_3, 222_3, 221_4, and 222_4 of the core dies 110 to 130 and 210 to 220 are disposed. The memory area 300 may include a bank 303, a row decoder 301, a column decoder 302, a command decoder 304, an address demultiplexer 308, a write driver 309, an input/output sense amplifier 310, and a data input/output circuit 305. The bank 303 may be a unit for dividing each of the above memory cell arrays 113, 123, 133, 213_1, 213_2, 223_3, and 223_4. The number of banks 303 may be one or more, and a plurality of banks 303 may be allocated to a channel.

The command decoder 304 may correspond to each of the above command decoders 114, 124, 134, 214_1, 214_2, 224_3, and 224_4, may decode a command (e.g., a broadcast command, an active command, a precharge command, a read command, a write command, and a refresh command) included in command and address signals CA, and may control components of the memory area 300. The row decoder 301 may select a word line(s) WL of the bank 303 corresponding to a row address provided from the address demultiplexer 308. The column decoder 302 may select a column selection line(s) of the bank 303 corresponding to a column address provided from the address demultiplexer 308 and bit lines connected to the column selection line(s). The address demultiplexer 308 may provide the row address to the row decoder 301 and the column address to the column decoder 302. The write driver 309 may write the write data of the data input/output circuit 305 to memory cells selected by the row decoder 301 and the column decoder 302. The input/output sense amplifier 310 may read data from the selected memory cells and may provide the read data to the data input/output circuit 305.

The data input/output circuit 305 may correspond to each of the above data input/output circuits 115, 125, 135, 215_1, 215_2, 225_3, and 225_4. The data input/output circuit 305 may include a write circuit 306 and a read circuit 307. The write circuit 306 may receive data included in the data input/output signals DQ of the common data input/output bus 102/202_1/202_2 based on a write data strobe signal WDQS, may parallelize the received data, and may provide the parallelized data to the write driver 309. The read circuit 307 may serialize data from the input/output sense amplifier 310 and may output the data input/output signals DQ including the serialized data to the common data input/output bus 102/202_1/202_2 based on a read data strobe signal RDQS. Instead of a bidirectional data strobe signal DQS, the write data strobe signal WDQS and the read data strobe signal RDQS may be used to capture the data input/output signals DQ. For another example, instead of the write data strobe signal WDQS and the read data strobe signal RDQS, the bidirectional data strobe signal DQS may be used to capture the data input/output signals DQ. In any case, the (write/read) data strobe signals WDQS/RDQS/DQS may be bidirectionally transmitted between the data input/output circuit 115/125/135/215_1/215_2/225_3/225_4 and the external device through the common data input/output bus 102/202_1/202_2, the data input/output buffering circuit 199/299_1/299_2, the pins 193/194/195/293_1/294_1/293_2/294_2, and the channels CH1/CH2/CH3/CH4.

Figure 15:
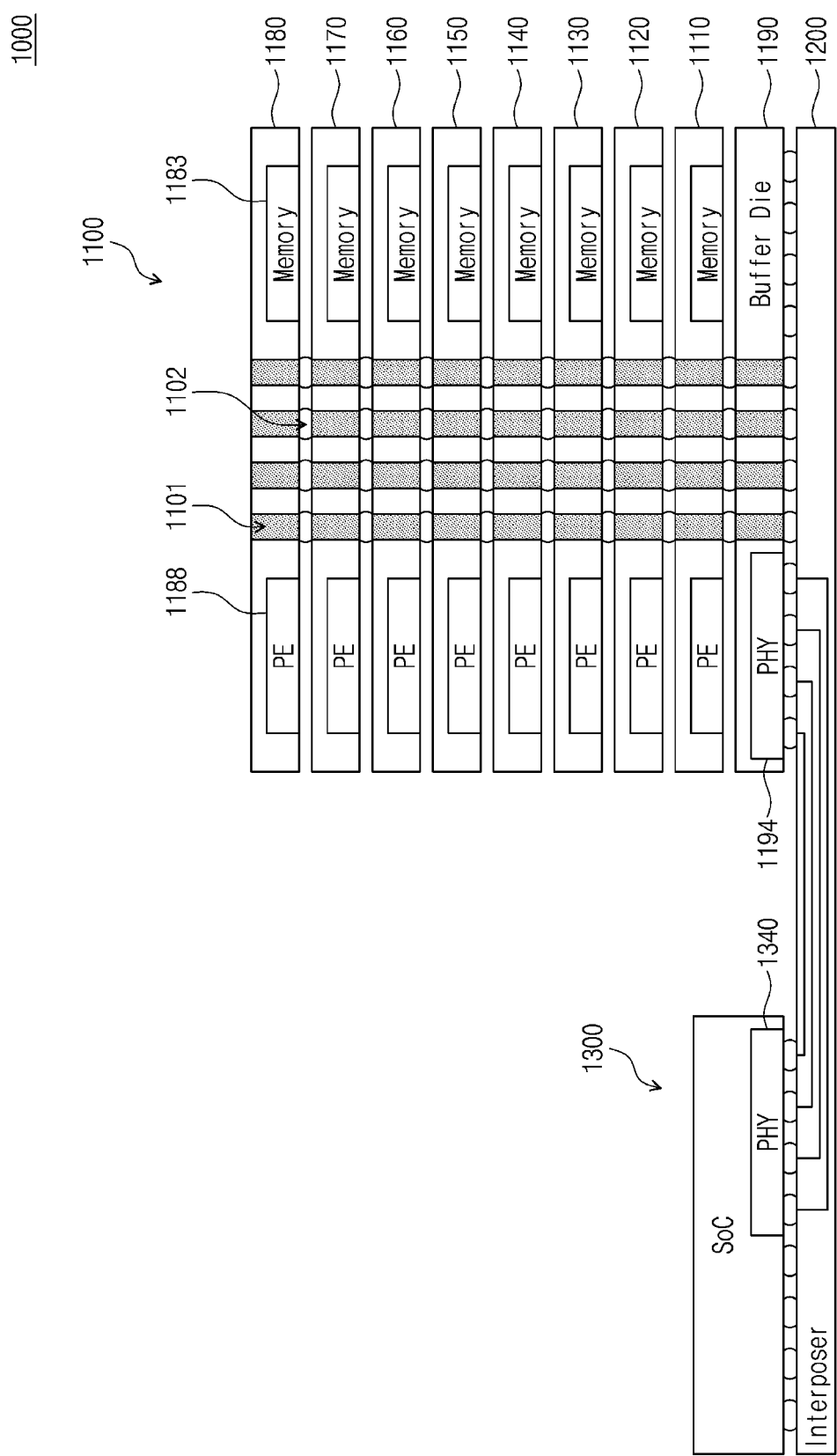
FIGS. 15 and 16 illustrate electronic devices according to example embodiments.

FIG. 15 illustrates an electronic device according to an example embodiment. An electronic device 1000 (or a computing/electronic system) may include a memory device 1100, an interposer 1200, and a system on chip 1300. The memory device 1100 may include core dies 1110 to 1180 and a buffer die 1190. Each of the core dies 1110 to 1180 may correspond to each of the above core dies 110 to 130, 210, and 220 and may be identically manufactured, and the buffer die 1190 may correspond to each of the above buffer dies 190 and 290. The number of core dies 1110 to 1180 is not limited to the example illustrated in FIG. 15. Each of the core dies 1110 to 1180 may include a memory area 1183 corresponding to the memory area 300 and a processing area 1188 where the processing circuit 118/128/138/218_1/218_2/228_3/228_4 is disposed. The buffer die 1190 may include a physical layer 1194 (hereinafter referred to as a "PHY"), and the PHY 1194 may include the components 193 to 199, 293_1 to 299_1, and 293_2 to 299_2 described above. The core dies 1110 to 1180 and the buffer die 1190 may be electrically interconnected through a plurality of TSVs 1101 and a plurality of micro bumps 1102. The TSVs 1101 may include the above TSVs 111, 112, 121, 122, 131, 132, 211_1, 212_1, 211_2, 212_2, 221_3, 222_3, 221_4, and 222_4.

In an example embodiment, the memory device 1100 may be a general-purpose DRAM device, such as a double data rate dynamic random access memory (DDR SDRAM), a mobile DRAM device, such as a low power double data rate (LPDDR) SDRAM, a graphics DRAM device, such as a graphics double data rate (GDDR) synchronous graphics dynamic random access memory (SGDRAM), or a DRAM device, which provides a high capacity and a high bandwidth, such that Wide I/O, a high bandwidth memory (HBM), HBM2, HBM3, or a hybrid memory cube (HMC). The interposer 1200 may connect the memory device 1100 and the system on chip 1300. The interposer 1200 may provide physical paths which connect the PHY 1194 of the memory device 1100 and a PHY 1340 of the system on chip 1300 and are formed of conductive materials for an electrical connection. The system on chip 1300 may correspond to the external device described above. The system on chip 1300 may execute applications, which the electronic device 1000 supports, by using the memory device 1100 and may be also referred to as an "application processor (AP)". The system on chip 1300 may include the PHY 1340 that is electrically connected to the PHY 1194 of the buffer die 1190 through the interposer 1200. The system on chip 1300 may store data to the memory device 1100 or may read data from the memory device 1100. The system on chip 1300 may generate various commands (e.g., commands associated with a read or write operation of the memory device 1100, the broadcast commands BCMD1 to BCMD3, and the processing commands PCMD1 and PCMD2) described with reference to FIGS. 1 to 14 and may transmit the generated commands to the memory device 1100.

Figure 16:
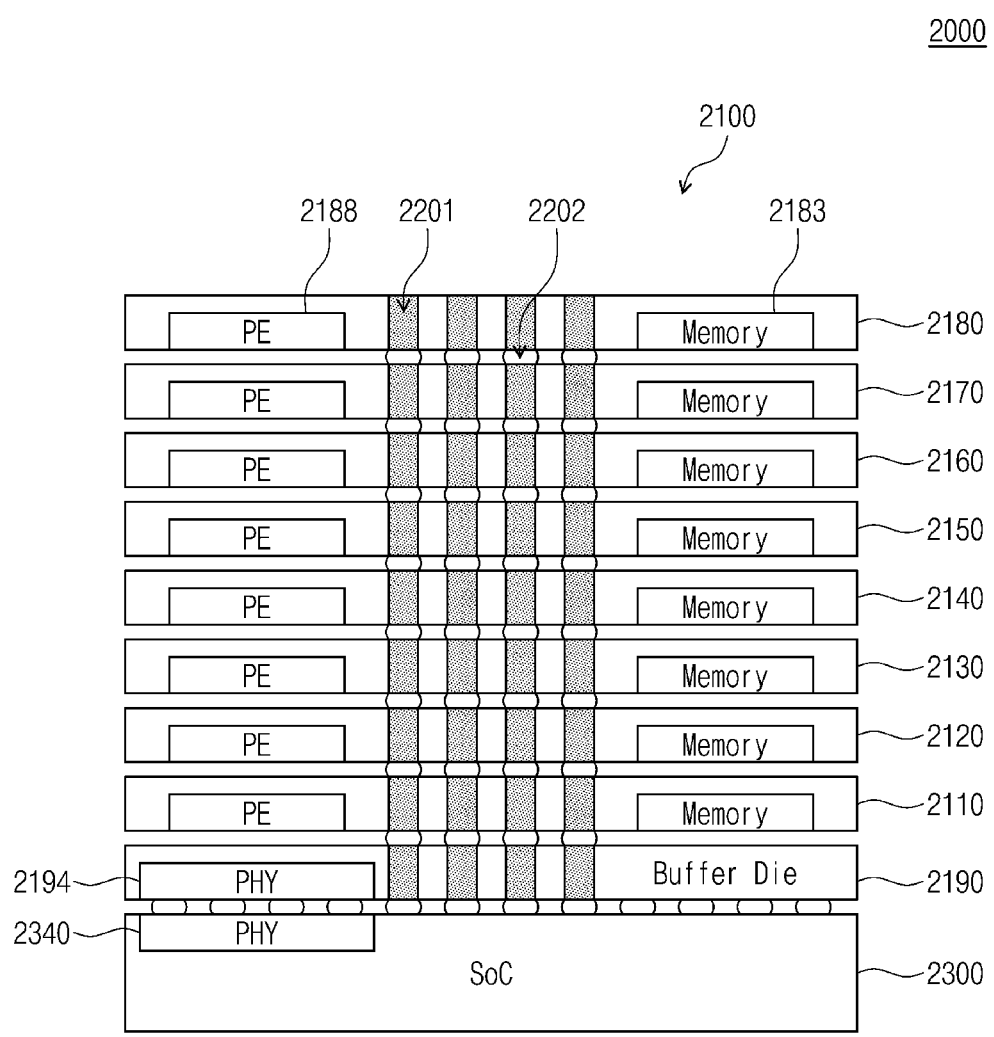

FIG. 16 is a diagram illustrating an electronic device according to another example embodiment. An electronic device 2000 may include a memory device 2100 including core dies 2110 to 2180 and a buffer die 2190, and a system on chip 2300 including a PHY 2340, and each of the core dies 2110 to 2180 may include a memory area 2183 and a processing area 2188 electrically interconnected through TSVs 2201 and micro bumps 2202 and respectively corresponding to the memory area 1183 and the processing area 1188. The memory device 2100 and the system on chip 2300 may correspond to the memory device 1100 and the system on chip 1300, respectively. The memory device 2100 may be disposed on the system on chip 2300, and the system on chip 2300 may further include the TSVs 2201 that are used to implement electrical connections with the memory device 2100.

Figure 17:
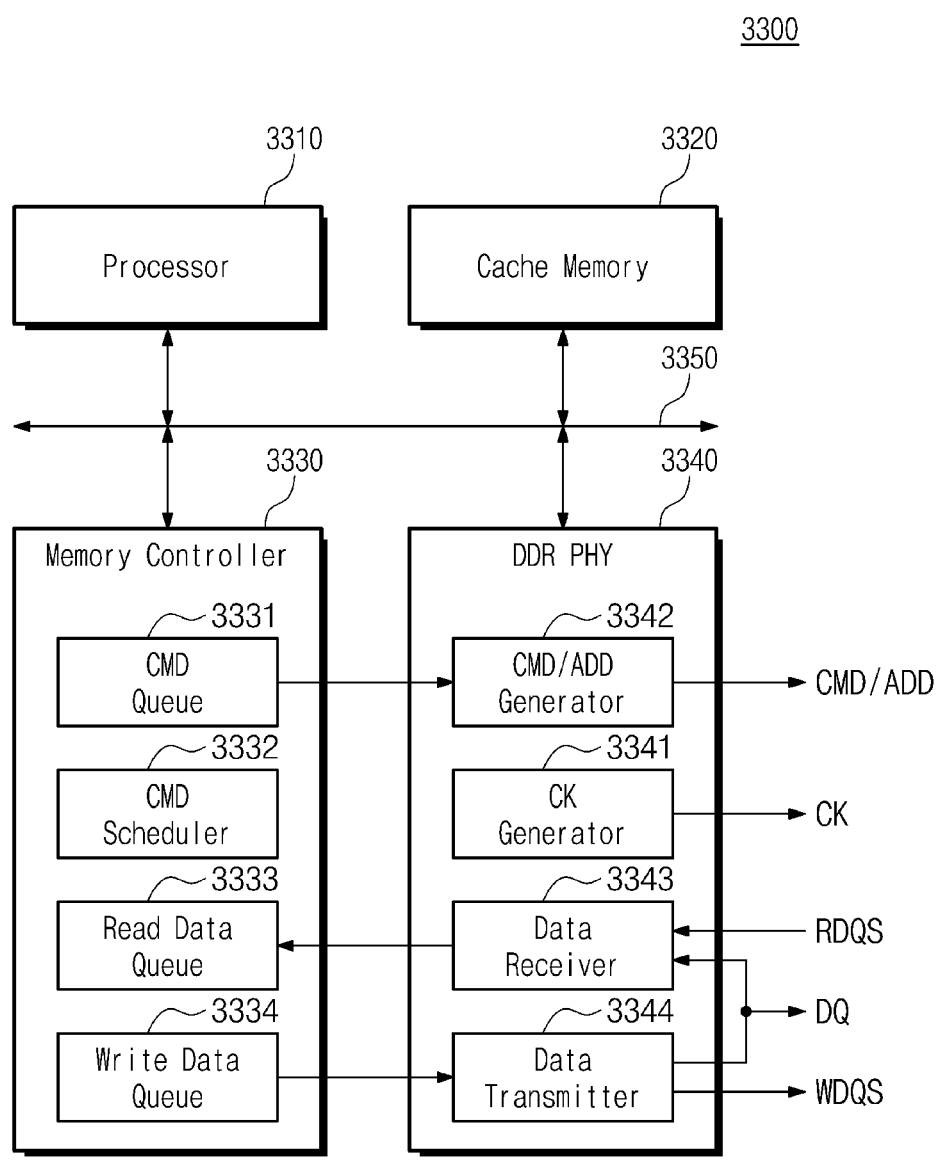
FIG. 17 illustrates a block diagram of system on chips according to an example embodiment.

FIG. 17 illustrates a block diagram of system on chips of FIGS. 15 and 16. A system on chip 3300 may correspond to the system on chips 1300 and 2300 described above, and may include a processor 3310, a cache memory 3320, a memory controller 3330, and a PHY 3340. A bus 3350 may provide a communication path between the processor 3310, the cache memory 3320, the memory controller 3330, and the PHY 3340. The processor 3310 may execute various software (e.g., an application program, an operating system, a file system, and a device driver) loaded to the cache memory 3320. The processor 3310 may include a homogeneous multi-core or a heterogeneous multi-core. For example, the processor 3310 may include at least one or more of a central processing unit (CPU), an image signal processing unit (ISP), a digital signal processing unit (DSP), a graphics processing unit (GPU), a vision processing unit (VPU), and a neural processing unit (NPU), and the number of processors 3310 may be one or more. An application program, an operating system, a file system, a device driver, etc. for driving the electronic device 1000/2000 may be loaded to the cache memory 3320. For example, the cache memory 3320 may be an SRAM device that has a faster data input/output speed than the memory device 1100/2100. The memory controller 3330 may access the memory device 1100/2100 in a direct memory access (DMA) manner. The memory controller 3330 may include a command queue 3331, a command scheduler 3332, a read data queue 3333, and a write data queue 3334. The command queue 3331 may store commands and addresses that are generated by the processor 3310 or are generated under control of the processor 3310. A command and an address stored in the command queue 3331 may be provided to the PHY 3340 under control of the command scheduler 3332. The command scheduler 3332 may adjust an order of commands and addresses stored in the command queue 3331, a time point when a command(s) and an address(es) are input to the command queue 3331, a time point when a command(s) and an address(es) are output from the command queue 3331, etc. The read data queue 3333 may store read data that the memory device 1100/2100 transmits through the PHY 3340 in response to the read command. The read data stored in the read data queue 3333 may be provided to the cache memory 3320 and may be processed by the processor 3310. The write data queue 3334 may store write data to be stored to the memory device 1100/2100. The write data stored to the write data queue 3334 by the write command may be transmitted to the memory device 1100/2100 through the PHY 3340. The components 3331 to 3334 may be implemented in the system on chip 3300 in the form of hardware, software, or a combination thereof. The PHY 3340 may include a clock generator 3341, a command and address generator 3342, a data receiver 3343, and a data transmitter 3344. The clock generator 3341 may generate a clock CK to be output to the memory device 1100/2100, and the number of clocks CK may correspond to the number of channels between the system on chip 3300 and the memory device 1100/2100. The command and address generator 3342 may receive a command or an address from the command queue 3331 and may transmit a command CMD or an address ADD to the memory device 1100/2100. For example, the command CMD may be one of various commands (e.g., commands associated with a read or write operation of the memory device 1100, the broadcast commands BCMD1 to BCMD3, and the processing commands PCMD1 and PCMD2) described with reference to FIGS. 1 to 14. The data receiver 3343 may receive read data of the data input/output signal DQ based on the read data strobe signal RDQS (or DQS) from the memory device 1100/2100. The data receiver 3343 may provide the received read data to the read data queue 3333. The data transmitter 3344 may receive write data from the write data queue 3334. The data transmitter 3344 may transmit the received write data to the memory device 1100/2100 based on the write data strobe signal WDQS (or DQS).

A memory device according to an example embodiment may execute the data movement between core dies based on a broadcast command from an external device, and thus, a latency between the memory device and the external device due to the data movement may be decreased.

While example embodiments have been described, it will be apparent to those of ordinary skill in the art that various changes and modifications may be made thereto without departing from the spirit and scope of the inventive concept as set forth in the following claims.

What is claimed is:

1. A memory device comprising:
a buffer die configured to receive a first broadcast command and a second broadcast command from an external device, control movement of data of a first memory cell array to a second memory cell array by transmitting the first broadcast command with a first identifier, and transmitting the second broadcast command with a second identifier; and
a plurality of core dice stacked on the buffer die, wherein the plurality of core dice comprise:
a first core die comprising a first processing circuit, the first memory cell array, a first command decoder configured to decode the first broadcast command based on the first identifier, and a first data input/output circuit configured to output the data of the first memory cell array to a common data input/output bus under control of the first command decoder; and
a second core die comprising a second processing circuit, the second memory cell array, a second command decoder configured to decode the second broadcast command based on the second identifier, and a second data input/output circuit configured to receive the data of the first memory cell array through the common data input/output bus under control of the second command decoder,
wherein the buffer die comprises a command and address buffering circuit configured to receive the first broadcast command from the external device through a first channel, receive the second broadcast command from the external device through a second channel, transmit the first broadcast command and the first identifier to the first command decoder through a common command and address bus, and transmit the second broadcast command and the second identifier to the second command decoder through the common command and address bus.

2. The memory device of claim 1, wherein the common data input/output bus comprises through silicon vias (TSVs) electrically connected to the first data input/output circuit, the second data input/output circuit and the buffer die.

3. The memory device of claim 1, wherein the common command and address bus that-comprises TSVs electrically connected to the first command decoder, the second command decoder and the buffer die.

4. The memory device of claim 1, wherein the buffer die further is further configured to receive a processing command from the external device,
 wherein one of the first processing circuit and the second processing circuit is further configured to decode the processing command and generate the data of the common data input/output bus by executing a processing operation on the data output from the first data input/output circuit to the common data input/output bus, and
 wherein the second data input/output circuit is further configured to transmit the data of the common data input/output bus to the second memory cell array.

5. The memory device of claim 1, wherein the buffer die is further configured to receive a processing command and external data from the external device,
 wherein one of the first processing circuit and the second processing circuit is further configured to decode the processing command and generate the data of the common data input/output bus by executing a processing operation on the data output from the first data input/output circuit to the common data input/output bus and the external data, and
 wherein the second data input/output circuit is further configured to transmit the data of the common data input/output bus to the second memory cell array.

6. The memory device of claim 1, wherein the plurality of core dice further comprises a third core die that comprises a third processing circuit, a third memory cell array, a third command decoder configured to decode a third broadcast command transmitted from the external device through the buffer die, and a third data input/output circuit configured to receive the data of the common data input/output bus under control of the third command decoder.

7. The memory device of claim 1, wherein the first core die further comprises a third processing circuit, a third memory cell array, a third command decoder configured to decode a third broadcast command transmitted from the external device through the buffer die, and a third data input/output circuit configured to receive the data of the first memory cell array transmitted from the first data input/output circuit under control of the third command decoder.

8. The memory device of claim 1, wherein the first processing circuit is configured to execute a first processing operation, and the second processing circuit is configured to execute a second processing operation different from the first processing operation.

9. A memory device comprising:
 a buffer die configured to receive first to fourth broadcast commands from an external device through first to fourth channels, respectively, and control movement of data of a first memory cell array to a third memory cell array by transmitting the first broadcast command with a first identifier, and transmitting the third broadcast command with a third identifier;
 a first core die comprising a first processing circuit and the first memory cell array allocated to the first channel, a second processing circuit and a second memory cell array allocated to the second channel, a first data input/output circuit configured to output the data of the first memory cell array to a first common data input/ output bus under control of a first command decoder, the first command decoder configured to receive the first broadcast command based on the first identifier, and a second data input/output circuit configured to output data of the second memory cell array to a second common data input/output bus under control of a second command decoder, the second command decoder configured to receive the second broadcast command; and
 a second core die comprising a third processing circuit and the third memory cell array allocated to the third channel, a fourth processing circuit and a fourth memory cell array allocated to the fourth channel, a third data input/output circuit configured to receive the data of the first memory cell array via the first common data input/output bus under control of a third command decoder, the third command decoder configured to receive the third broadcast command based on the third identifier, and a fourth data input/output circuit configured to receive the data of the second common data input/output bus under control of a fourth command decoder, the fourth command decoder configured to receive the fourth broadcast command,
 wherein the buffer die is further configured to receive fifth to eighth broadcast commands from the external device through the first to fourth channels,
 wherein the first data input/output circuit of the first core die is configured to output data of the first memory cell array to a third common data input/output bus of the first core die under control of the first command decoder, the first command decoder configured to receive the fifth broadcast commands,
 wherein the second data input/output circuit of the first core die is configured to receive data of the third common data input/output bus of the first core die under control of the second command decoder, the second command decoder configured to receive the sixth broadcast command,
 wherein the third data input/output circuit of the second core die is configured to output data of the third memory cell array to a fourth common data input/output bus of the second core die under control of the third command decoder, the third command decoder further configured to receive the seventh broadcast command, and
 wherein the fourth data input/output circuit of the second core die is configured to receive data of the fourth common data input/output bus of the second core die under control of the fourth command decoder, the fourth command decoder further configured to receive the eighth broadcast command.

10. The memory device of claim 9, wherein the buffer die is further configured to receive first and second processing commands from the external device through the first and second channels,
 wherein the first processing circuit is configured to decode the first processing command and generate the data of the first common data input/output bus by executing a first processing operation on the data output from the first data input/output circuit to the first common data input/output bus, and
 wherein the second processing circuit is configured to decode the second processing command and generate the data of the second common data input/output bus by executing a second processing operation on the data output from the second data input/output circuit to the second common data input/output bus.

11. The memory device of claim 9, wherein the buffer die is further configured to receive third and fourth processing commands from the external device through the third and fourth channels,
 wherein the third processing circuit is configured to decode the third processing command and generate the data of the first common data input/output bus by executing a third processing operation on the data output from the first data input/output circuit to the first common data input/output bus, and
 wherein the fourth processing circuit is configured to decode the fourth processing command and generate the data of the second common data input/output bus by executing a fourth processing operation on the data output from the second data input/output circuit to the second common data input/output bus.

12. The memory device of claim 9, wherein each of the first to fourth processing circuits comprise:
 a fifth command decoder configured to decode a processing command transmitted from the external device through each of the first to fourth channels; and
 an arithmetic logic unit (ALU) configured to execute a processing operation under control of the fifth command decoder.

13. The memory device of claim 12, wherein each of the first to fourth processing circuits further comprises a data buffer configured to store data from the ALU.

14. The memory device of claim 9, wherein the buffer die is further configured to receive ninth and tenth broadcast commands from the external device through fifth and sixth channels, respectively, and
 wherein the memory device further comprises: a third core die that comprises a fifth processing circuit, a fifth memory cell array allocated to the fifth channel, a sixth processing circuit, a sixth memory cell array allocated to the sixth channel, a fifth data input/output circuit configured to receive the data of the first common data input/output bus under control of a fifth command decoder, the fifth command decoder configured to receive the ninth broadcast command, and a sixth data input/output circuit configured to receive the data of the second common data input/output bus under control of a sixth command decoder, the sixth command decoder configured to receive the tenth broadcast command.

15. An electronic device comprising:
 a memory device that comprises a buffer die, a first core die comprising a first processing circuit, a first command decoder and a first memory cell array allocated to a first channel, and a second core die comprising a second processing circuit, a second command decoder and a second memory cell array allocated to a second channel; and
 a system on chip configured to transmit a first broadcast command and a second broadcast command requesting movement of data from the first core die to the second core die to the buffer die of the memory device through the first channel and the second channel, respectively,
 wherein the buffer die is configured to control movement of the data from the first core die to the second core die by transmitting the first broadcast command with a first identifier, and transmitting the second broadcast command with a second identifier, and
 wherein the buffer die comprises a command and address buffering circuit configured to receive the first broadcast command from an external device through a first channel, receive the second broadcast command from the external device through a second channel, transmit the first broadcast command and the first identifier to the first command decoder through a common command and address bus, and transmit the second broadcast command and the second identifier to the second command decoder through the common command and address bus.

16. The electronic device of claim 15, wherein the system on chip is further configured to transmit a processing command, which requests the first processing circuit to perform a processing operation on the data, to the buffer die of the memory device through the first channel.

17. The electronic device of claim 15, wherein the system on chip is further configured to transmit a processing command, which requests the second processing circuit to perform a processing operation on the data, to the buffer die of the memory device through the second channel.

18. The electronic device of claim 15, wherein the memory device further comprises a third core die comprising a third processing circuit and a third memory cell array allocated to a third channel, and
 wherein the system on chip is further configured to transmit first to third broadcast commands requesting movement of data from the first core die to the second and third core dice to the buffer die of the memory device through the first to third channels, respectively.

* * * * *